(12) United States Patent
Yoshihara et al.

(10) Patent No.: US 6,787,929 B2
(45) Date of Patent: Sep. 7, 2004

(54) SEMICONDUCTOR DEVICE HAVING A FLAT PROTECTIVE ADHESIVE SHEET

(75) Inventors: Shinji Yoshihara, Nagoya (JP); Yasuo Souki, Toyota (JP); Kinya Atsumi, Okazaki (JP); Hiroshi Muto, Nagoya (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 09/785,464

(22) Filed: Feb. 20, 2001

(65) Prior Publication Data

US 2001/0008300 A1 Jul. 19, 2001

Related U.S. Application Data

(62) Division of application No. 09/444,724, filed on Nov. 24, 1999, now Pat. No. 6,245,593.

(30) Foreign Application Priority Data

Nov. 27, 1998 (JP) ............................................. 10-337930
Jul. 6, 1999 (JP) ............................................. 11-192292

(51) Int. Cl.$^7$ ........................ H01L 23/29; H01L 23/31; H01L 21/301; G01L 9/04; G01P 10/08
(52) U.S. Cl. ...................... 257/792; 257/790; 257/788; 257/467; 257/468; 257/469; 257/783; 257/620; 257/619; 257/415; 257/622; 257/419
(58) Field of Search ................................ 257/792, 790, 257/787–788, 467–469, 783, 687, 619, 622, 623, 415, 419, 666, 738, 797; 438/106, 118, 127, 458, 462, 113

(56) References Cited

U.S. PATENT DOCUMENTS 4,921,564 A   5/1990  Moore
5,435,876 A * 7/1995  Alfaro et al. ................ 156/247
5,597,767 A   1/1997  Mignardi et al.
5,605,844 A * 2/1997  Oki et al.
5,641,714 A * 6/1997  Yamanaka .................... 438/14
5,759,874 A * 6/1998  Okawa ........................ 438/124
5,824,177 A * 10/1998 Yoshihara et al. ........... 156/250
5,843,251 A * 12/1998 Tsukagoshi et al. ........... 156/64
5,976,691 A   11/1999 Noguchi et al.
6,066,404 A * 5/2000  Suzuura et al. ............. 428/516
6,255,741 B1 * 7/2001  Yoshihara et al. ........... 257/792
6,287,885 B1 * 9/2001  Muto et al. ................... 438/48
6,429,506 B1 * 8/2002  Fujii et al. .................. 257/620
6,475,881 B1 * 11/2002 Yamada ....................... 438/464
2002/0093076 A1 * 7/2002  Fujii et al. .................. 257/620

FOREIGN PATENT DOCUMENTS

| JP | 8-323737    | * | 12/1996 |
| JP | 9-27466     | * | 1/1997  |
| JP | 10-242253   | * | 9/1998  |
| JP | 2000-31349  | * | 1/2000  |
| JP | 2000-031349 | * | 1/2000  |
| JP | 2000-340526 | * | 12/2000 |

* cited by examiner

*Primary Examiner*—Alexander Oscar Williams
(74) *Attorney, Agent, or Firm*—Harness, Dickey & Pierce, PLC

(57) ABSTRACT

A semiconductor device has a semiconductor wafer having sensing portions exposed on a surface thereof and an adhesive sheet attached to the semiconductor wafer as a protective cap to cover the sensing portions. The adhesive sheet is composed of a flat adhesive sheet and adhesive disposed generally on an entire surface of the adhesive sheet. Adhesion of the adhesive is selectively reduced by UV irradiation to have adhesion reduced regions, and the adhesion reduced regions face the sensing portions. The protective cap can be produced with high productivity, and securely protect the sensing portions when the semiconductor wafer is diced and is transported.

11 Claims, 22 Drawing Sheets

SEMICONDUCTOR DEVICE HAVING A FLAT PROTECTIVE ADHESIVE SHEET

This application is a Divisional of Ser. No. 09/444,724 filed Nov. 24, 1999, now U.S. Pat. No. 6,245,593.

CROSS REFERENCE TO RELATED APPLICATIONS

This application is based upon and claims the benefit of Japanese Patent Applications No. 10-337930 filed on Nov. 27, 1998, and No. 11-192292 filed on Jul. 6, 1999, the contents of which are incorporated herein by reference.

BACKGROUND OF THE INVENTION

1. Field of the Invention

This invention relates to semiconductor devices having a movable portion inside a chip, such as a capacity type acceleration sensor, a yaw rate sensor and a pressure sensor, and having a mechanically weak structure such as an air-bridge wiring structure, and to methods of manufacturing the same.

2. Description of the Related Art

A semiconductor wafer such as a silicon wafer on which several semiconductor integrated circuit elements are formed is usually cut by a dicing-cut device for individual semiconductor chips while being disposed on an adhesive—sheet. The dicing-cut device requires a large amount of cutting water to remove undesirable silicon chips, radiate heat, and to facilitate the cutting.

However, when the elements to be divided include an element such as a capacity type acceleration sensor having a movable portion, or an element on which a mechanically weak structure such as an air-bridge wiring structure is exposed, such functional elements are easily broken by pressure and surface tension produced by the large amount of cutting water.

To solve this problem, JP-A-7-99172 proposes a method for dicing a silicon wafer while covering an exposed weak structure with a tape as a provisonal protective cap. The tape has an adhesive pattern to be attached to the semiconductor wafer. As a result of studies on this method, however, the following problems were found. Specifically, when the adhesive pattern is printed on the tape, a width of the pattern is, for example, 0.2 mm at least since it is limited by a mask material, printing conditions, and the like. When the tape is adhered to the semiconductor wafer, the adhesive pattern is further widended by pressure. The widened adhesive pattern may reach the exposed structure on the semiconductor wafer. When the adhesive pattern is formed with a large gap in consideration of the above problem, an area of the tape must be increased. The tape having the increased area is not suitable for an element having a reduced size. Thus, in the method desclosed in the above document, since the width of the adhesive pattern is varied when the adhesive pattern is adhered, it is difficult to securely protect the exposed structure on the wafer.

JP-A-9-27466 discloses another method for provisioanlly covering an exposed structure on a wafer with a adhesive sheet as a protective cap. The adhesive sheet is formed to have a dome portion for covering the exposed structure to prevent from being stuck to the exposed structure. This method involves difficulty for controlling the shape of the dome portion, and low productivity (through put) due to the formation of the dome portion performed by heating, and the like. Here, it should be noted that the protective caps disclosed in the documents described above protect the exposed structure not only during the dicing but also during transportation. The protective caps make the handling in the transportation easy.

SUMMARY OF THE INVENTION

The present invention has been made in view of the above problems. An object of the present invention is to provide a semiconductor device having exposed structure portions protected with a protective cap to be divided by dicing with high productivity and capable of being easily handled when transported, and to a method of manufacturing the same.

To achieve the object described above, a semiconductor device includes an adhesive sheet detachably attached to a semiconductor wafer and covering a structure portion exposed on the semiconductor wafer. The adhesive sheet is composed of a flat sheet member and an adhesive portion provided generally on an entire surface of the sheet member. The adhesive portion has a specific region facing the structure portion with an adhesion that is smaller than that of a vicinal region of the adhesive portion surrounding the specific region.

According to the present invention described above, since the adhesive sheet as a protective cap is flat, it is not necessary to form a dome portion and the like, resulting in high productivity. Since the adhesive portion is disposed generally on the entire surface of the sheet member, the adhesive portion is not widened when attached to the semiconductor wafer, and therefore, it does not invade into the structure portion. The semiconductor wafer can be diced and be transported in a state where the structure potion is securely protected by the adhesive sheet. The handling when dicing and transporting the semiconductor wafer is easy.

Preferably, the adhesive portion is made of a UV setting adhesive, an adhesion of which is reduced by UV. Accordingly, the adhesion of the specific region of the adhesive portion can be easily reduced by UV irradiation, resulting in high productivity of the protective cap.

When the semiconductor device is manufactured, the adhesive sheet can be attached to the semiconductor wafer after or before the adhesion of the adhesive portion at the specific region is selectively reduced. When the structure portion is exposed on both (first and second) surfaces of the semiconductor wafer, preferably, first and second adhesive sheets are attached to the first and second surfaces of the semiconductor wafer to cover the structure portion. The semiconductor wafer can be diced with the structure portion protected by the adhesive sheet. After that, the adhesive sheet can be easily removed by entirely reducing its adhesion.

BRIEF DESCRIPTION OF THE DRAWINGS

Other objects and features of the present invention will become more readily apparent from a better understanding of the preferred embodiments described below with reference to the following drawings, in which.

Figure 1A:
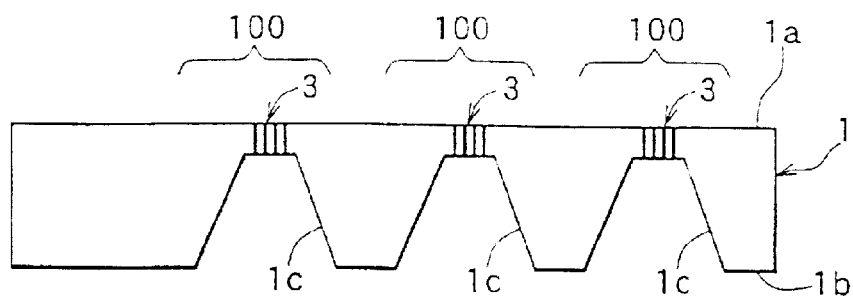
FIGS. 1A through 5 are cross-sectional views showing a manufacturing process of acceleration sensors in a step-wise manner in a first preferred embodiment.

DETAILED DESCRIPTION OF THE PREFERRED EMBODIMENTS (First Embodiment)

In a first preferred embodiment, the present invention is applied to several acceleration sensors (chips) 100, a manufacturing process of which is shown in FIGS. 1–5. A semiconductor device according to the present invention is indicated with reference numeral 200 in FIGS. 2B and 2C, and includes a semiconductor wafer 1 having movable portions and mechanically weak structures exposed on a surface thereof, and a protective cap (first adhesive sheet) 2.

First, the semiconductor wafer 1 and the first adhesive sheet 2 are prepared. As shown in FIG. 1A, the several acceleration sensors 100 are formed on the semiconductor wafer 1 for chip units by well-known micromachine processing. Each of the acceleration sensors 100 has a comb-like beam structure as a sensing portion 3. For example, the sensing portion 3 is a capacity detecting type having a movable electrode and a fixed electrode. The sensing portion 3 is exposed on a surface (main surface) 1a of the semiconductor wafer 1, with a low mechanical strength. Opening portions 1c are formed on the other surface (back surface) 1b of the semiconductor wafer 1 by etching using anisotropic etching solution. Accordingly, the sensing portion 3 is exposed on both surfaces 1a, 1b of the semiconductor wafer 1.

Figure 1B:
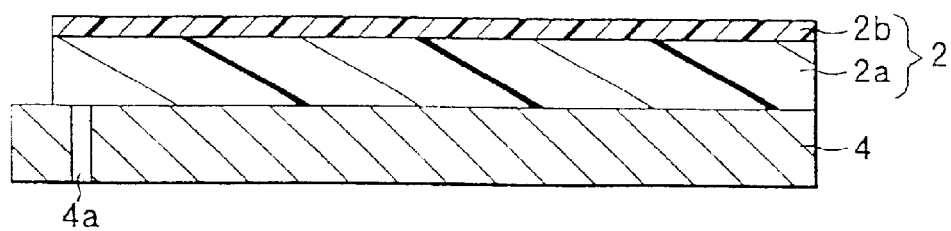

As shown in FIG. 1B, the first adhesive sheet 2 is composed of a flat sheet member 2a and adhesive (adhesive portion) 2b disposed generally on the entire surface of the sheet member 2a. The adhesive 2b needs not be always disposed completely on the entire surface of the sheet member 2a. This means that an outer peripheral portion of the surface of the sheet member 2a may not be always completely covered with the adhesive 2b. The sheet member 2a is made of, for example, polyolefine family resin. The adhesive 2b is made of UV setting resin such as acrylic family resin. Thus, the first adhesive sheet 2 is a UV setting adhesive sheet. Adhesion of the adhesive 2b is decreased by UV irradiation.

The first adhesive sheet 2 is fixed a flat plate 4 show in FIG. 1B at a side opposite to the adhesive 2b. Specifically, the first adhesive sheet 2 is fixed to the plate 4 by vacuum attraction performed by a vacuum chuck stage (not shown), which is disposed under the plate 4, via a through hole 4a defined in an edge portion of the plate 4. Accordingly, even when the first adhesive sheet 2 is charged, static electricity is removed through the plate 4 having conductivity.

Figure 1C:
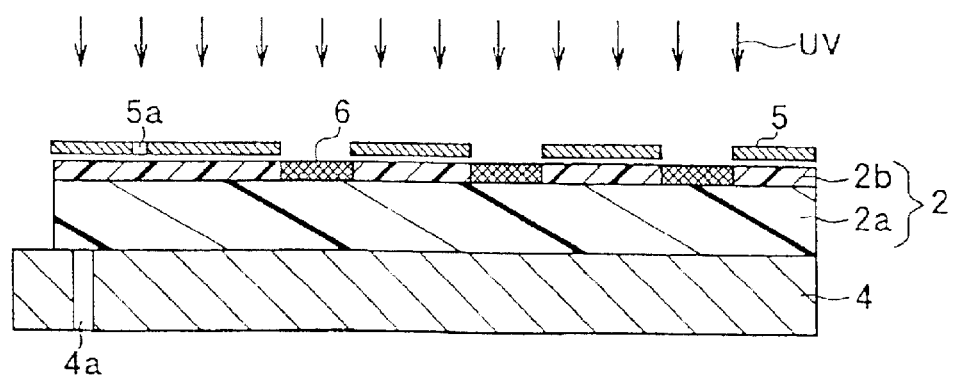
Figure 6A:
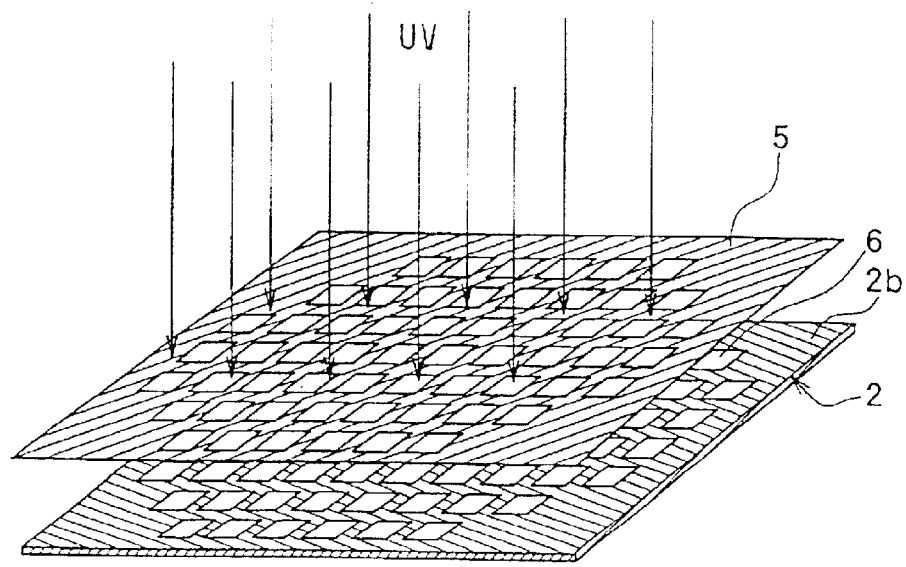
FIGS. 6A and 6B are perspective views for supplementarily explaining the manufacturing steps shown in FIGS. 1 and 2.
Figure 6B:
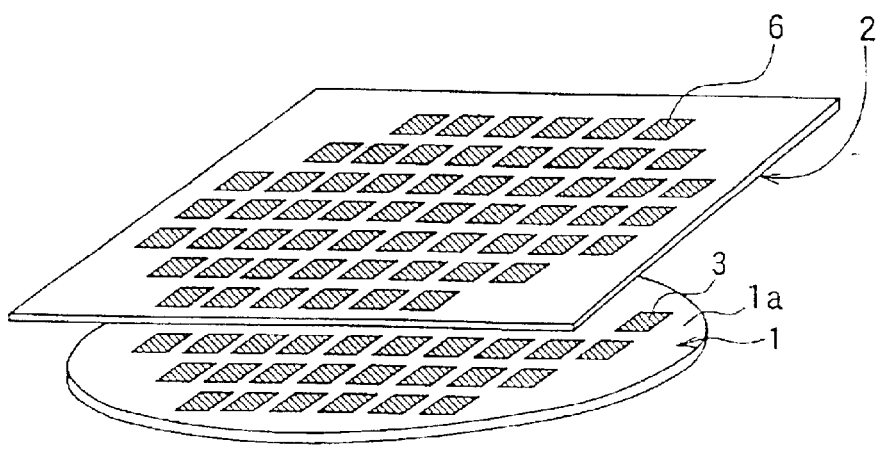
Figure 7:
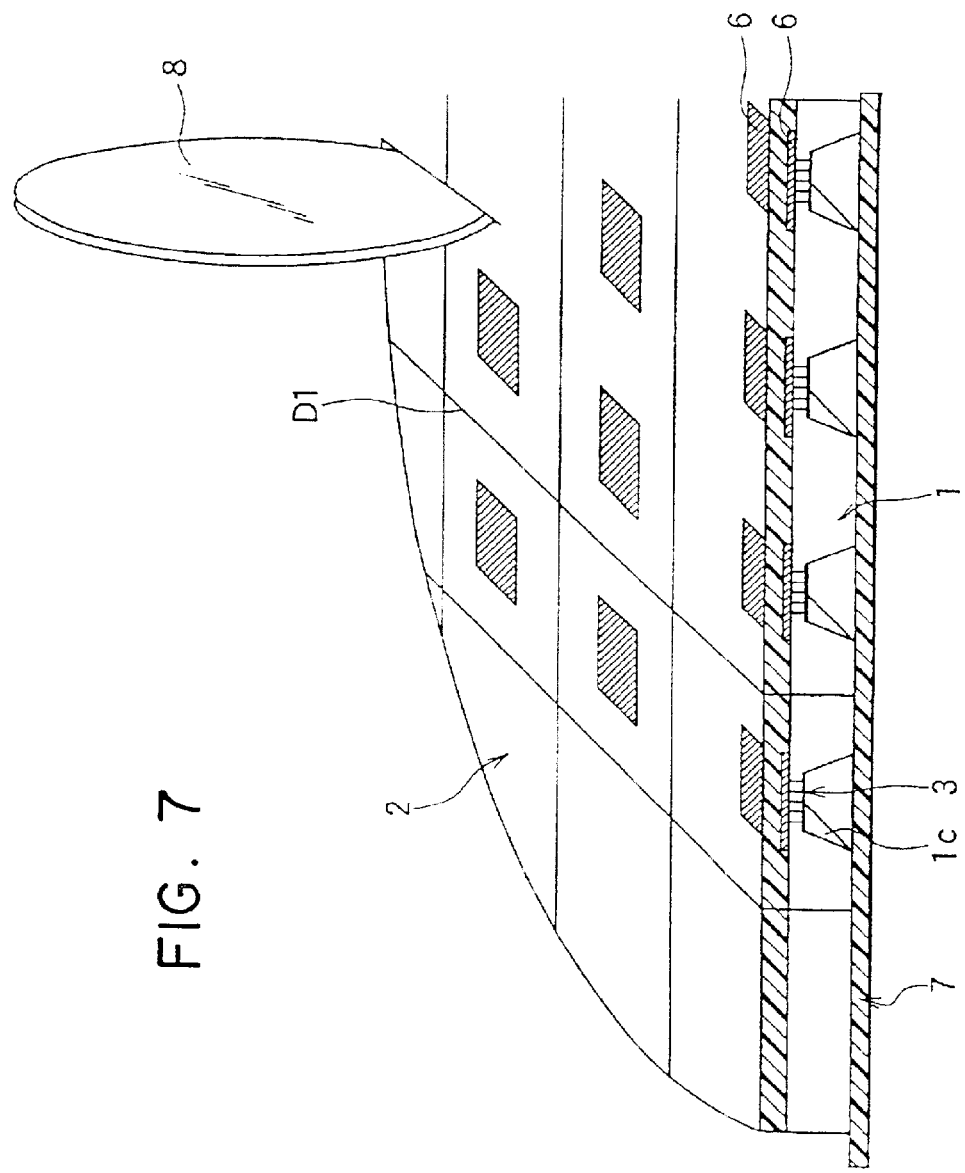
FIG. 7 is a perspective view for supplementarily explaining the manufacturing step showing in FIG. 3A.
Figure 8:
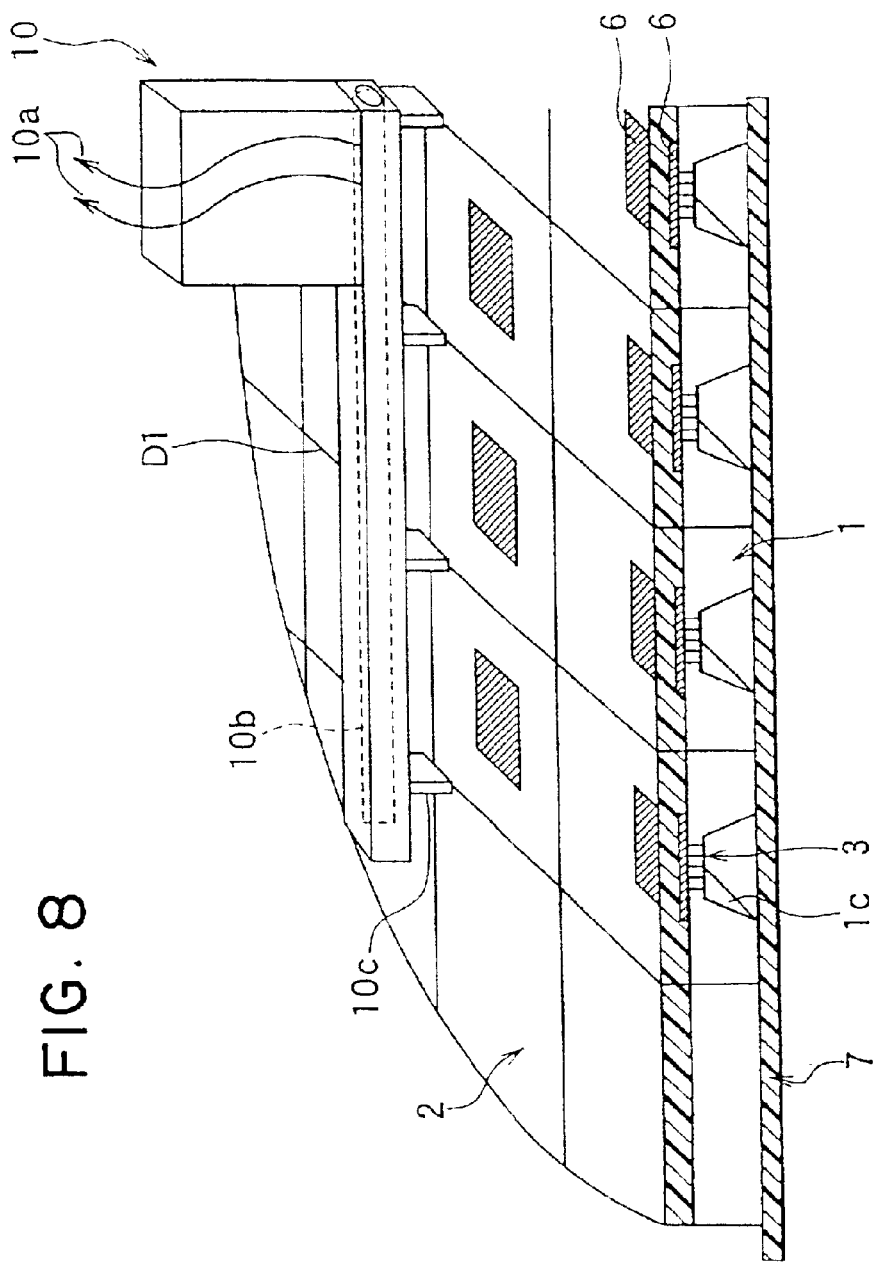
FIG. 8 is a perspective view showing a modified example of the manufacturing method of the acceleration sensors in the first embodiment.

Next, as shown in FIGS. 1C and 6A, at an adhesion selectively reducing step, the adhesion of the first adhesive sheet 2 is selectively reduced. After the surface of the first adhesive sheet 2 at the side of the adhesive 2b is entirely covered with a mask 5 having openings corresponding to the sensing portions 3, the adhesive sheet 2 is irradiated with UV having a wavelength of 254 nm or less so that regions exposed to UV are hardened. Accordingly, the adhesive 2b of the first adhesive sheet 2 has hardened regions 6, which have reduced adhesion to be opposed to the sensing portions 3, thereby providing the protective cap. In FIGS. 6B, 7, and 8, the hardened regions 6 are hatched with slant lines.

Figure 2A:
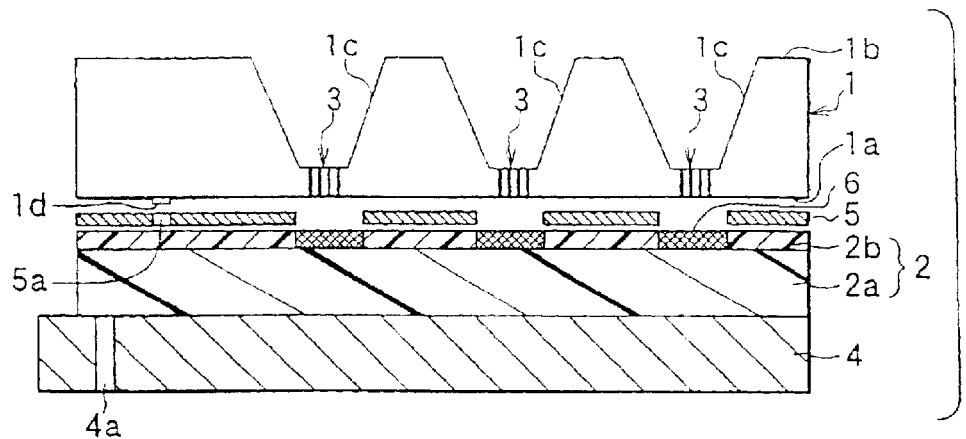

Subsequently, as shown in FIG. 2A, at a positioning step, the first adhesive sheet 2 is positioned onto the surface 1a of the semiconductor wafer 1 through the mask 5 covering the first adhesive sheet 2. The positioning between the exposed regions (hardened regions) 6 of the first adhesive sheet 2 and the sensing portions 3 is carried out by fitting a mark 5a defined in the mask 5 to a mark 1d formed on the wafer 1. After the positioning, the mask 5 disposed between the wafer 1 and the first adhesive sheet 2 is removed. FIG. 6B shows the state where the mask 5 is removed.

The adhesive 2b may include a material that reacts with UV to be colored to improve the positioning accuracy. For example, when the adhesive 2b is added with pigment that is colored by UV, the mark 5a of the mask 5 can be used as an opening for exposing the adhesive 2b to UV. The exposed adhesive portion is colored by UV irradiation. Accordingly, visual observation of the exposed adhesive portion becomes possible, so that the first adhesive sheet 2 can be directly positioned to the semiconductor wafer 1 without interposing the mask 5 therebetween. Consequently, the positioning accuracy is improved. Although the adhesive sheet 2 is attached to the semiconductor wafer 1 in the following step, when the exposed portion is colored, the attachment position can be confirmed by a visual inspection after the attachment.

Figure 2B:
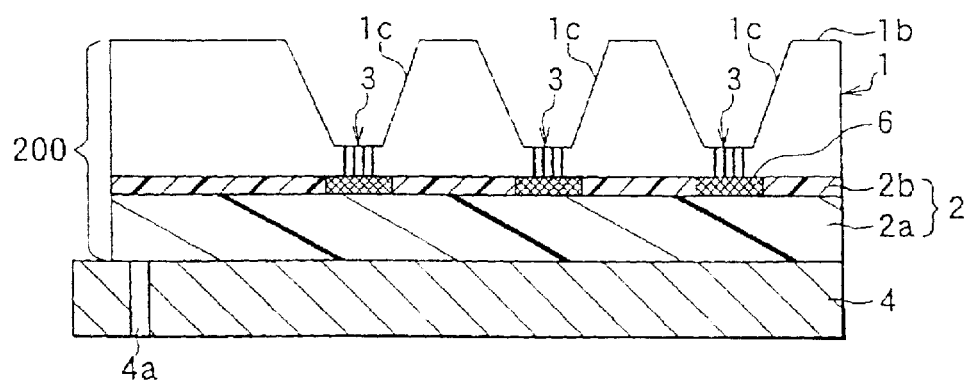

Next, as shown in FIG. 2B, at a first adhesive sheet attachment step, the surface 1a of the wafer 1 and the surface of the first adhesive sheet 2 at the adhesive side are adhered to each other. At that time, bubbles may be produced between the wafer 1 and the first adhesive sheet 2. The produced bubbles include oxygen therein which causes adhesive residue by oxygen inhibition when the sheet 2 is exposed to UV at an adhesion entirely reducing step (described below). Specifically, when oxygen exists between the wafer 1 and the first adhesive sheet 2, oxygen inhibits reaction of the adhesive to UV at the adhesion entirely reducing step so that the adhesion of the adhesive sheet cannot be sufficiently reduced. This may inhibit removal of the adhesive sheet after dicing. To avoid this problem, it is advisable to perform the attachment while purging with inert gas such as nitrogen gas. Otherwise, the attachment may be carried out under vacuum to eliminate bubbles. This attachment manner further prevents deficiencies such as invasion of cutting water into the sensing portions 3 through bubbles at dicing.

A semiconductor device 200 in the present invention is completed by finishing the first adhesive sheet attachment step described above. As described above, the semiconductor device 200 is composed of the semiconductor wafer 1 having the sensing portions 3 as exposed structure portions and the first adhesive sheet 2 attached to the semiconductor wafer 1 to cover the sensing portions 3 as a detachable protective cap. The first adhesive sheet 2 has the sheet member 2a and the adhesive 2b disposed generally on the entire surface of the sheet member 2a and having the hardened regions 6. The hardened regions 6 have reduced adhesion and face the sensing portions 3.

Figure 2C:
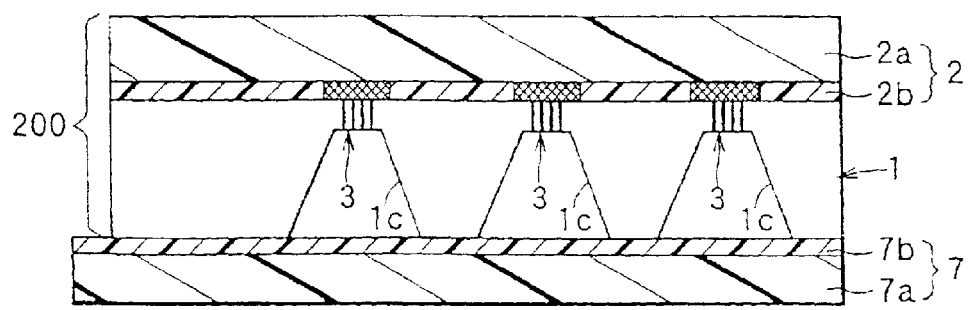

Next, the vacuum attraction by the vacuum chuck stage not shown is stopped, and the wafer 1 to which the adhesive sheet 2 is attached, i.e., the semiconductor device 200 is detached from the plate 4. Then, as shown in FIG. 2C, at a second adhesive sheet attachment step, a second adhesive sheet 7 is adhered to the other surface 1b of the semiconductor wafer 1. The second adhesive sheet 7 is, similarly to the first adhesive sheet 2, composed of a sheet member 7a and adhesive 7b disposed generally on the entire surface of the sheet member 7a. Also in this case, it is preferable that the attachment be carried out while purging with inert gas.

Figure 3A:
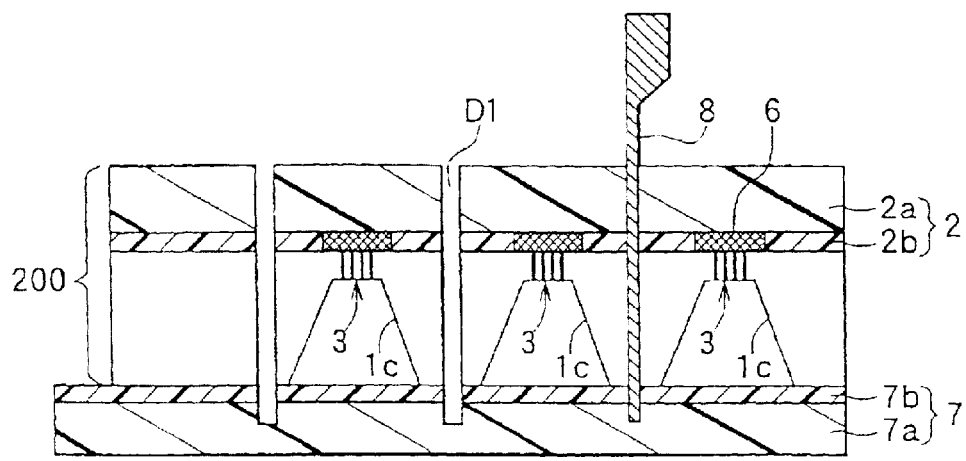
Figure 3B:
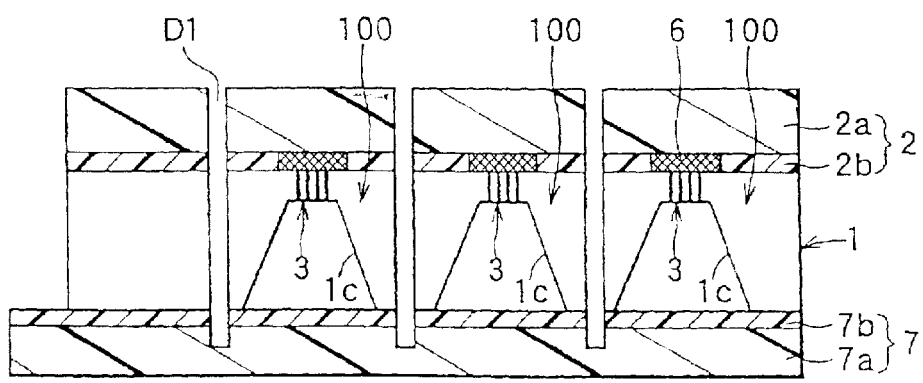

Next, as shown-in FIGS. 3A and 7, at a dicing-cut step, the semiconductor wafer 1 is cut into individual chips by a dicing blade 8 from the surface 1a to the other surface 1b together with the first adhesive sheet 2. In the figures, D1 represents dicing-cut portions cut by dicing. FIG. 3B shows a state after the dicing-cut is finished. The wafer 1 is divided into individual chips by the dicing-cut portions D1. Accordingly, the semiconductor device 200 is divided into the chips, so that several (three in FIG. 3B) acceleration sensors 100 are produced.

Figure 4A:
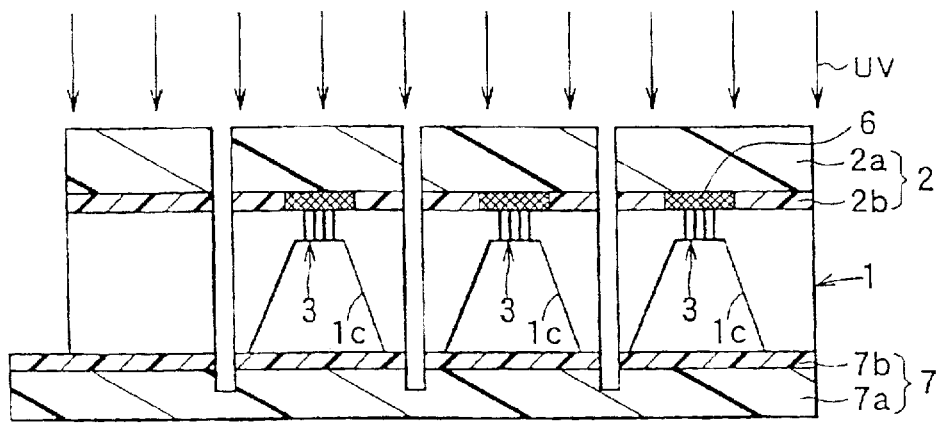
Figure 4B:
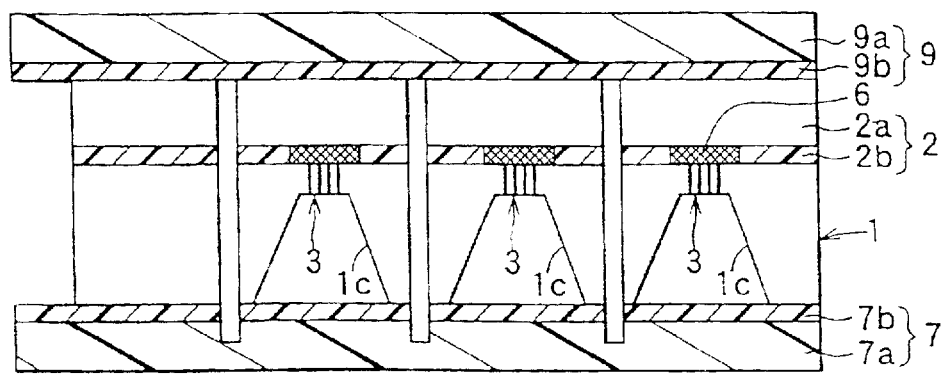

Next, as shown in FIG. 4A, at an adhesion entirely reducing step, the entire surface of the first adhesive sheet 2 at the side opposite to the adhesive 2b is irradiated with UV, so that the adhesion is reduced at the entire region of the adhesive 2b to facilitate the removal of the first adhesive sheet 2 from the chips. As shown in FIG. 4B, a third adhesive sheet 9 is then adhered to the first adhesive sheet 2 at the side opposite to the adhesive 2b. The third adhesive sheet 9 is, similarly to the first adhesive sheet 2, composed of a sheet member 9a and adhesive 9b disposed generally on the entire surface of the adhesive sheet 9a. The third adhesive sheet 9 has adhesion as large as possible because its purpose is to detach the first adhesive sheet 2 from the chips. For example, when the first adhesive sheet 2 is a UV setting type adhesive sheet with the sheet member 2a containing polyolefine family resin as a main component, the third adhesive sheet 9 has no problem providing that it is a UV setting type adhesive sheet having peel strength of approximately 1 kg/25 mm or more.

Figure 5:
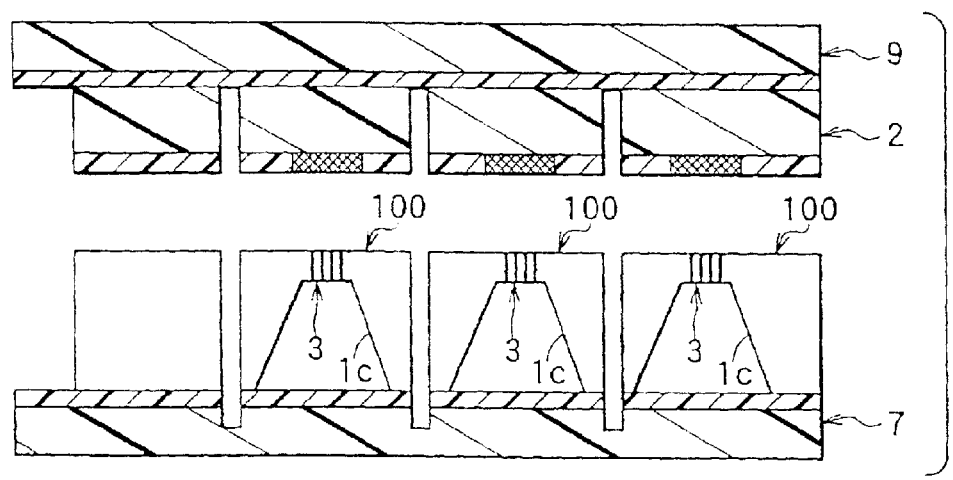

Then, as shown in FIG. 5, at a first adhesive sheet removing step, the first adhesive sheet 2 is removed from the chips divided by dicing-cut, i.e., from the divided acceleration sensors 100. The first adhesive sheet 2 is easily removed from the surface 1a of the wafer 1 by pulling up the third adhesive sheet 9 from the end of the wafer 1. In FIG. 5, the divided acceleration sensors 100 are adhered to the second adhesive sheet 7; however, they are detached from the second adhesive sheet 7 to be used as sensors, respectively.

The first adhesive sheet 2 is, as shown in FIG. 4A, divided into pieces by dicing-cut in the present embodiment; however, a modification shown in FIG. 8 is adoptable to improve yield (removing rate) when the first adhesive sheet 2 is detached and removed from the wafer 1. That is, a comb-like heater 10 may be moved along the dicing cut portions (dicing lines) D1 to fuse the cut portions so that the sheet 2 can be removed as one integrated sheet. The comb-like heater 10 is energized to heat a pole-like heater portion 10b indicated with broken lines in FIG. 8, and heat is transmitted from the heater portion 10b to a comb-like fusing portion 10c.

According to the present embodiment, the first adhesive sheet (protective cap) 2 is made flat in the semiconductor device 200, which is formed by finishing the first adhesive sheet attachment step shown in FIG. 2B. It is not necessary to shape the sheet 2 to have dorm portions or the like as a conventional manner. Further, this makes it possible to selectively harden the sheet 2 by UV irradiation so that the adhesion is selectively decreased. It is not necessary to control temperatures of jigs and the like for the process described above. As a result, the protective cap can be formed with high productivity (through put).

Also, in the semiconductor device 200, the adhesive 2b of the first adhesive sheet 2 is disposed generally on the entire surface of the sheet member 2a with the regions 6 having decreased adhesion to face the sensing portions 3. The adhesive 2b is not widened at the first adhesive sheet attachment step, and therefore, the adhesive 2b does not invade into the sensing portions 3. Accordingly, the first embodiment can provide the semiconductor device 200 capable of securely protecting the sensing portions 3 of the semiconductor wafer 1 with the protective cap (first adhesive sheet 2), which is formed with high productivity.

At the dicing-cut step, the protective cap is adhered to the wafer 1 at regions other than the sensing portions 3 with adhesion of the adhesive 2b to seal the sensing portions 3. The wafer 1 can be divided into semiconductor chips while protecting the sensing portions 3 from cutting water, cut chips, and the like. The protective cap further prevent invasion of foreign matters, damages, and the like which occur when the semiconductor wafer 1 is transported, thereby making handling easy when transporting.

Also, in the present embodiment, the adhesive 2b is UV setting adhesive, and is selectively hardened by UV irradiation using the mask 5 having openings corresponding to the sensing portions 3. Therefore, the hardened regions 6 having decreased adhesion can be accurately and readily formed in the adhesive 2b to correspond to the sensing portions 3. That is, the first adhesive sheet (protective cap) 2 having the hardened regions 6 for facing the sensing portions 3 can be produced with high efficiency.

Although the sensing portions 3 are exposed on both surfaces 1a, 1b of the semiconductor wafer 1, the sensing portions 3 can be securely protected by the first and second adhesive sheets 2, 7. As to the first adhesive sheet 2, the adhesion of the adhesive 2b is entirely decreased after the dicing-cut step. Therefore, the first adhesive sheet 2 is easily removed from the semiconductor chips (divided acceleration sensors 100) cut by dicing. Further, as described above, since the first adhesive sheet attachment step (FIG. 2B) and the second adhesive sheet attachment step (FIG. 2C) are performed under inert gas or vacuum, deficiencies caused by oxygen inhibition can be prevented.

The adhesion selectively reducing step shown in FIGS. 1C and 6 uses UV of 254 nm or less in wavelength. UV of 365 nm or less is sufficient only for selectively reducing adhesion. However, it is found that UV of 254 nm or less in wavelength is more preferable because the adhesive 2b is oxidized by the UV to be slightly etched so that a gap is produced between the adhesive sheet 2 and the sensing portions 3. This gap inhibits the contact between the adhesive sheet 2 and the sensing portions 3. The step for fixing the first adhesive sheet 2 onto the plate 4 shown in FIG. 1B is simultaneously a step for removing static electricity from the adhesive sheet 2 as described above. Therefore, when the first adhesive sheet 2 is adhered to the semiconductor wafer 1, the semiconductor wafer 1 is not charged by static electricity, so that deficiencies such as sticking (attachment) at the sensing portions 3 in which movable portions or mechanically weak structures are exposed do not occur. At the second adhesive sheet attachment step (FIG. 2C), likewise, static electricity can be removed from the second adhesive sheet 7 by bringing the surface of the second adhesive sheet 7 at a side opposite to the adhering surface into contact with the plate 4 or other conductive members.

(Second Embodiment)

In the first embodiment described above, the sensing portions of the acceleration sensors are exposed on both surfaces of the wafer. In a second preferred embodiment, the present invention is applied to acceleration sensors respectively having sensing portions which are not exposed on both surfaces of a semiconductor wafer. In the second embodiment, the same parts as those in the first embodiment are explained with the same reference numerals.

Figure 9A:
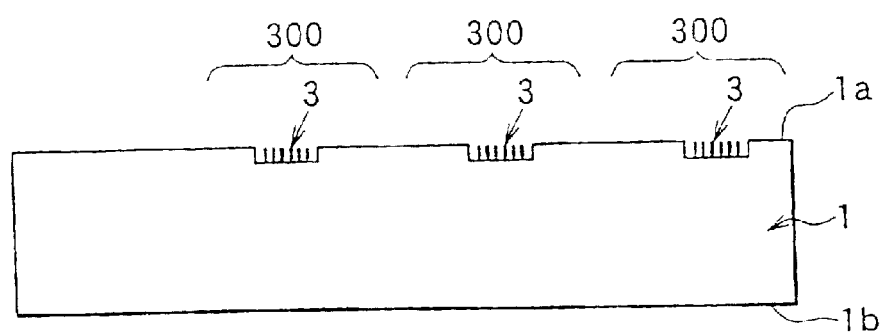
FIGS. 9A through 11 are cross-sectional views showing a manufacturing method of acceleration sensors in a step-wise manner in a second preferred embodiment.

First, a semiconductor wafer 1 and an adhesive sheet 2 are prepared. As shown in FIG. 9A, several acceleration sensors 300 are formed on the semiconductor wafer 1 for chip units by well-known micromachine processing. Each of the acceleration sensors 300 is, as in the first embodiment, a capacity detecting type and has a sensing portion 3 as a exposed structure portion. Each sensing portion 3 is exposed only on the surface 1a of the semiconductor wafer 1, and is not exposed on the other surface 1b. The adhesive sheet 2 has substantially the same structure as that in the first embodiment.

Then, as in the first embodiment, the adhesive sheet 2 is fixed to the plate 4 by vacuum attraction performed through the through hole 4a by the vacuum chuck stage not shown. Accordingly, even when the adhesive sheet 2 is charged, static electricity is removed from the adhesive sheet 2 through the plate 4. The vacuum chuck stage disposed under the plate 4 may be a stage of a dicing-cut device (not shown). Otherwise, the plate 4 itself may be the stage of the dicing-cut device.

Next, the adhesion selectively reducing step is performed substantially in the same manner as in the first embodiment using UV and the mask 5 so that the adhesion of the adhesive sheet 2 is selectively reduced. Accordingly, the adhesive sheet 2 having the hardened regions 6 in the adhesive 2b for facing the sensing portions 3, i.e., the protective cap in the present invention is provided. When the wavelength of UV is 254 nm or less, the effects described in the first embodiment can be provided.

Figure 12:
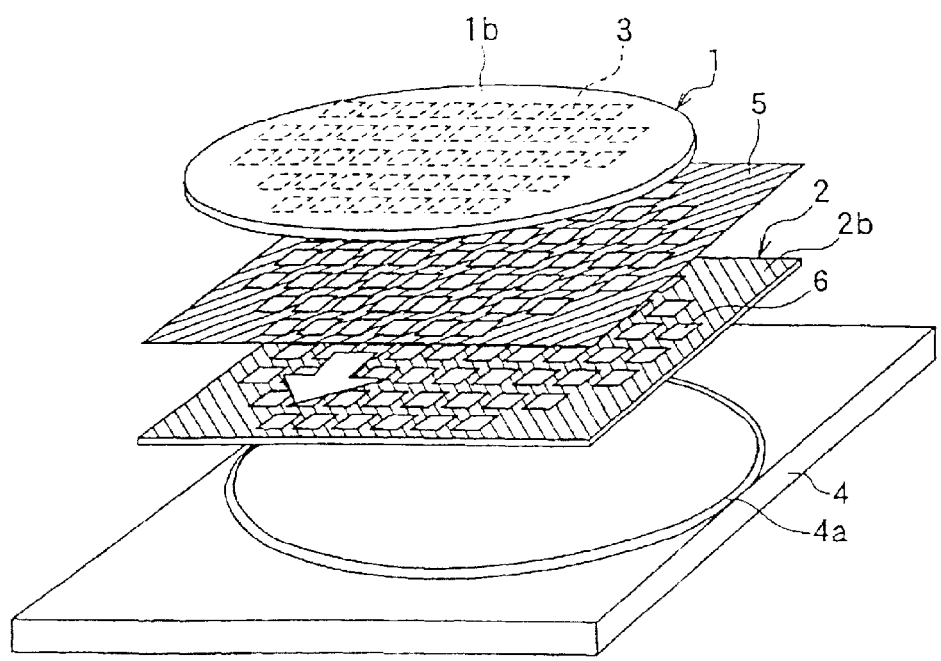
FIG. 12 is a perspective view for supplementarily explaining the manufacturing step shown in FIG. 9B.

Next, the positioning between the semiconductor wafer 1 and the adhesive 2 (positioning step) is carried out similarly to the positioning step in the first embodiment. That is, the surface 1a of the semiconductor wafer 1 is made to face the surface of the adhesive sheet 2 covered with the mask 5, and the mark 5a of the mask 5 is made to fit the mark 1d of the wafer 1. After finishing the positioning step, the mask 5 disposed between the wafer 1 and the adhesive sheet 2 is removed. FIG. 12 is a birds-eye view showing a state where the mask 5 is just removed in a direction indicated with an arrow. In FIG. 12, the marks 1d, 5a are not shown. The sensing portions 3, which are not exposed on the back surface 1b of the wafer 1, are indicated with broken lines. As described in the first embodiment, when the adhesive 2b includes a material that is colored by UV, the positioning can be readily and precisely carried out.

Figure 9B:
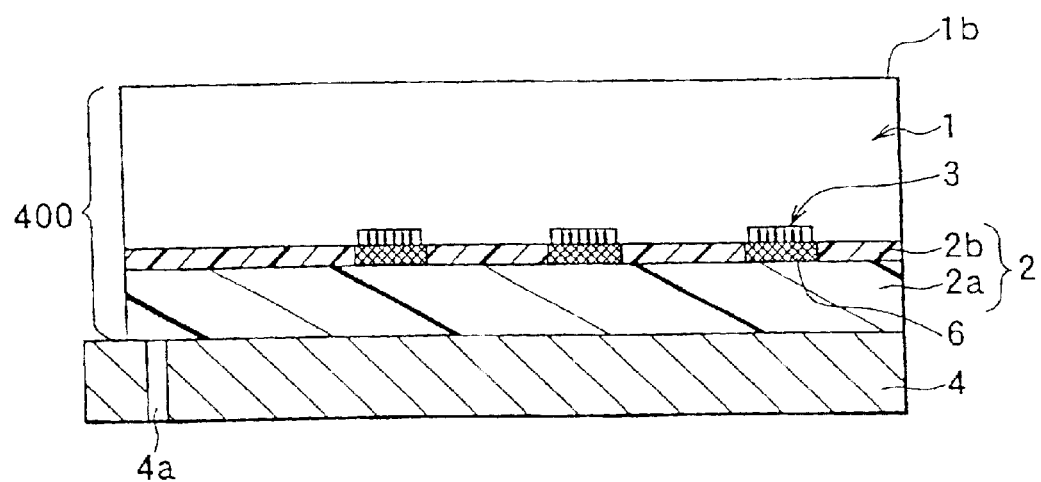

Next, as shown in FIG. 9B, the adhesive sheet 2 is adhered to the surface 1a of the semiconductor wafer 1 (adhesive sheet attachment step) substantially in the same manner as the first adhesive sheet attachment step in the first embodiment. Likewise, it is preferable to perform this step under inert gas or vacuum to prevent deficiencies caused by oxygen inhibition. According to the completion of the adhesive sheet attachment step, a semiconductor device 400 in the second embodiment is completed.

The semiconductor device 400 is composed of the semiconductor wafer 1 having the sensing portions 3 as exposed structure portions, and the adhesive sheet 2 disposed on the semiconductor wafer 1 as a detachable protective cap to cover the sensing portions 3. The adhesive sheet 2 is composed of the flat sheet member 2 and the adhesive (adhering portion) 2b provided generally on the entire surface of the sheet member 2a and including regions having selectively reduced adhesion for facing the sensing portions 3. The features are almost the same as those of the semiconductor device 200 in the first embodiment except for the exposed structure of the sensing portions 3.

Figure 10A:
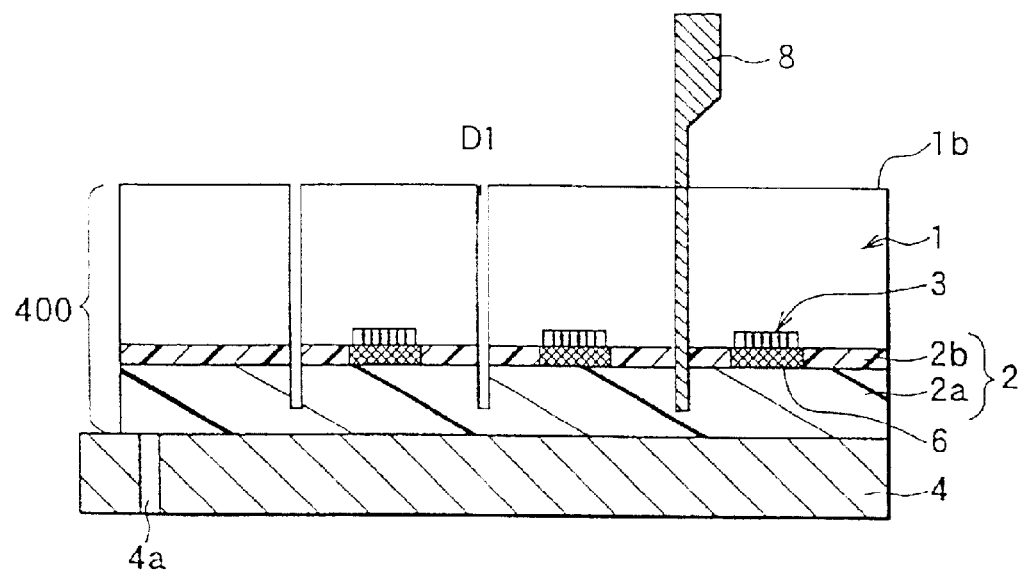
Figure 13:
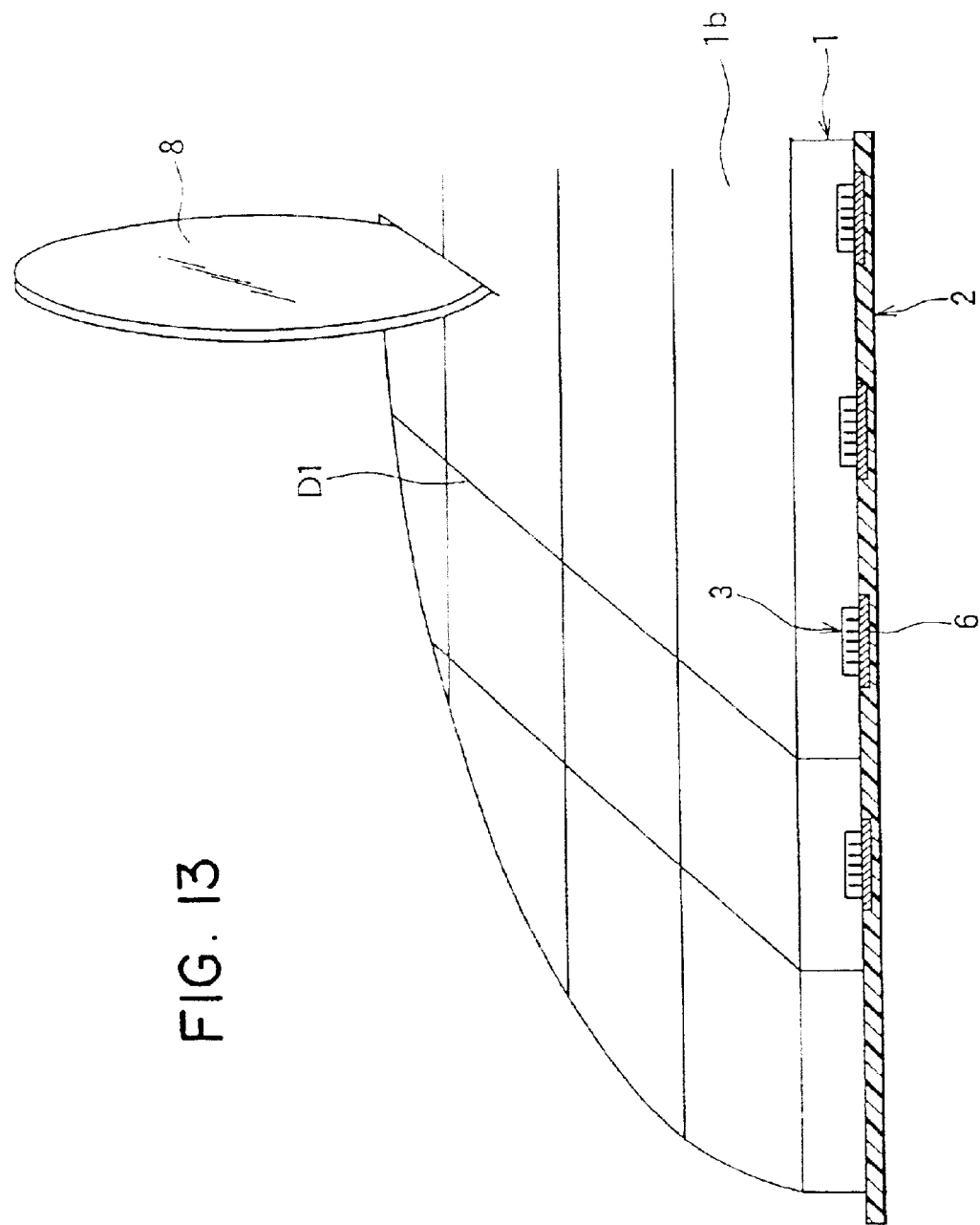
FIG. 13 is a perspective view for supplementarily explaining the manufacturing step shown in FIG. 10A.

Next, as shown in FIGS. 10A and 13, at the dicing-cut step, the semiconductor wafer 1 is cut for chip units together with the adhesive sheet 2 by dicing in a direction from the back surface 1b to the surface 1a of the semiconductor wafer 1. The adhesive sheet 2 is integrally connected at the sheet member 2a after the dicing-cut step. Several (three in FIG. 10B) acceleration sensors 300 divided from the semiconductor device 400 into chips are provided by the dicing-cut step.

Figure 10B:
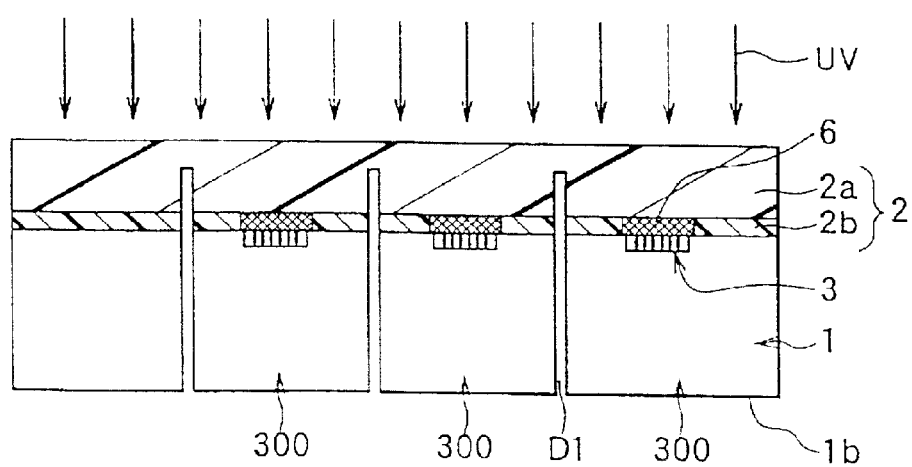
Figure 11:
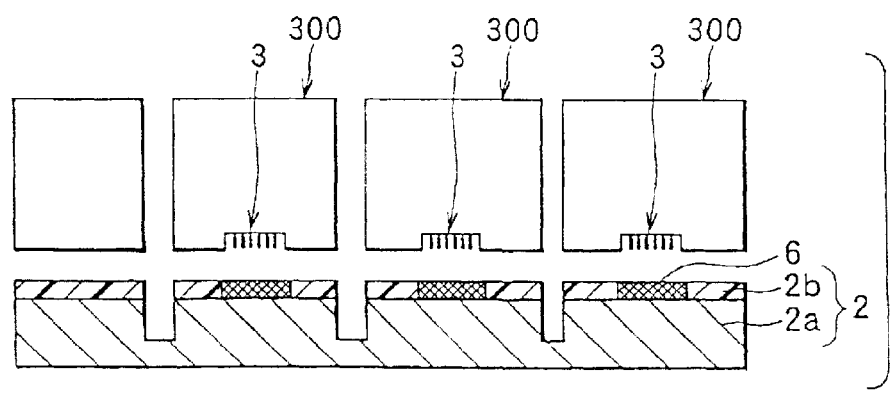

Next, as shown in FIG. 10B, the adhesive sheet 2 is removed from the acceleration sensors 300, i.e., from the divided chips. Specifically, at the adhesion entirely reducing step, the surface of the adhesive sheet 2 on a side opposite to the adhesive 2b is entirely exposed to UV so that the adhesion of the adhesive 2b is entirely reduced. After that, as shown in FIG. 11, the adhesive sheet 2 is removed from the chips. At that time, the chips are easily picked up by expanding the gaps of the dicing portions D1. The gaps of the dicing portions D1 can be expanded by expanding the adhesive sheet 2.

In the present embodiment, the sensing portions 3 are exposed only on one surface of the semiconductor wafer 1. This is different from the first embodiment. Accordingly, only one adhesive sheet is required, so that the number of steps for adhering and detaching the adhesive sheet is decreased, resulting in high productivity. Because the amount of the adhesive sheet to be cut by dicing is also reduced as compared to the first embodiment, a load to the dicing blade 8 is lessened. The other features and effects are the same as those in the first embodiment.

(Third Embodiment)

In the first and second embodiments described above, manufacturing methods for forming the acceleration sensors 100, 300 by dicing the semiconductor wafers are explained. A manufacturing method in a third preferred embodiment may involve only steps for forming the semiconductor device 200 or 400. That is, after the first adhesive sheet attachment step shown in FIG. 2B in the first embodiment or after the adhesive sheet attachment step shown in FIG. 9B in the second embodiment is performed, the manufacturing process can be finished.

In the third embodiment, since the sensing portions 3 of the semiconductor wafer 1 are protected from external force at subsequent steps, transportation between the steps becomes easy. The protective cap (the adhesive sheet 2 in the first or second embodiment) may be detached after the transportation, otherwise, be left as the protective cap for chips until a mounting step is performed after the dicing-cut step. The protective cap may be kept in the state after being exposed to UV as shown in FIG. 4B or 10B, i.e., in the state after the adhesion entirely reducing step.

(Fourth Embodiment)

As described in the third embodiment, the manufacturing method for forming the semiconductor device 200 or 400 involves at least the step for preparing the semiconductor wafer and the adhesive sheet, the adhesion selectively reducing step, and the attachment step. After theses steps, the adhesive sheet can be detached from the semiconductor wafer, and the regions of the semiconductor wafer to which the adhesive sheet has been adhered may be treated by ashing using ozone or oxygen radical.

The detachment of the adhesive sheet may be performed after dicing, or after the transportation for dicing and before the dicing. In either case, when residue of adhesive remains on the semiconductor wafer after the adhesive sheet is detached, the residue can be removed by the ashing using ozone or oxygen radical. The ashing is performed by generating oxygen radical as a result of a reaction between oxygen in air and UV, and by blowing air including the oxygen radical toward the semiconductor wafer. For example, in the first adhesive sheet removing step shown in FIG. 5, after the first adhesive sheet 2 is removed from the surface 1a of the wafer 1, the surface of the wafer 1 is treated by ashing. As a result, the acceleration sensors 100 are provided without holding residue of the adhesive.

(Fifth Embodiment)

A fifth preferred embodiment is obtained by modifying the first embodiment described above, and provides a manufacturing method for forming the semiconductor device 200 and the acceleration sensors 100, which are explained in the first embodiment. FIGS. 14–18 show the manufacturing steps, in which the same parts as those in the first embodiment are indicated with the same reference numerals.

Figure 14A:
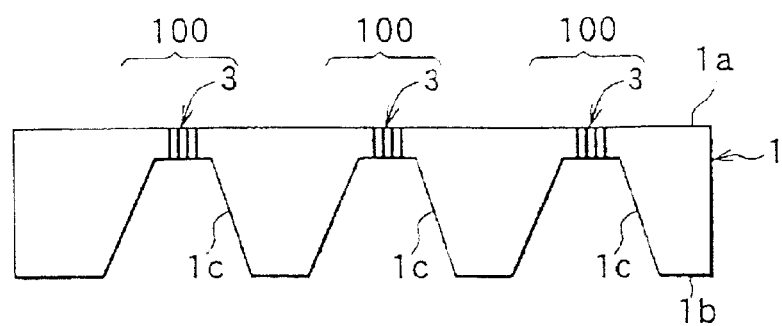
FIGS. 14A through 18B are cross-sectional views for explaining a manufacturing method of acceleration sensors in a step-wise manner in a fifth preferred embodiment.
Figure 14B:
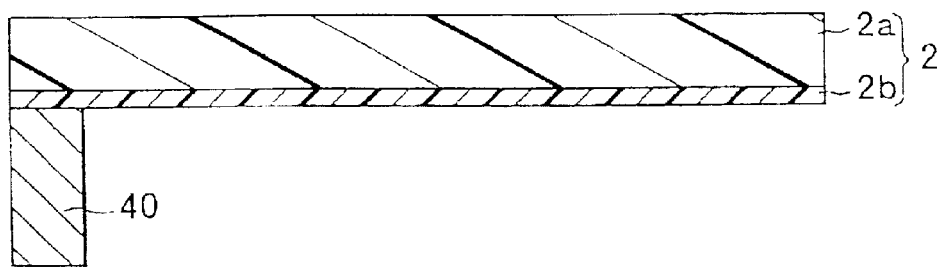
Figure 14C:
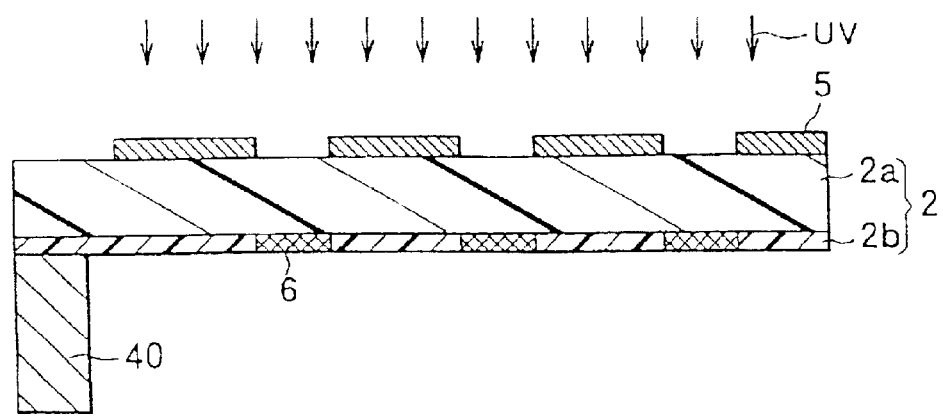

First, as shown in FIGS. 14A and 14B, the semiconductor wafer 1 having the sensing portions 3 exposed on both surfaces 1a, 1b of the wafer 1, and the first adhesive sheet 2 composed of the sheet member 2a and the adhesive 2b are prepared. The first adhesive sheet 2 has an area larger than that of the semiconductor wafer 1. As shown in FIG. 14B, the first adhesive sheet 2 on a side of the adhesive 2b is fixed to an annular frame 40 made of metal (for example, stainless) having rigidity. The annular frame 40 suppresses the adhesion between the frame 40 and the adhesive 2b at a minimum so that the frame 40 is easily detached from the adhesive sheet 2 in a subsequent step. The hollow portion of the frame 40 has a size sufficient for holding the semiconductor wafer 1. FIGS. 14B and 14C show only a side of the annular frame 40 in cross-section.

Next, the adhesion selectively reducing step shown in FIG. 14C is preformed. In the present embodiment, after a metallic (for example, stainless) mask 5 having an opening pattern corresponding to the sensing portions 3 is attached to the entire surface of the first adhesive sheet 2 at a side opposite to the adhesive 2b, the first adhesive sheet 2 is irradiated with UV having a wavelength of 365 nm or less. Accordingly, the adhesive 2b is selectively hardened by being exposed to UV through the sheet member 2a at regions corresponding to the opening portions of the mask 5, thereby providing the first adhesive sheet (protective cap) 2 having hardened regions 6 with reduced adhesion.

Figure 15A:
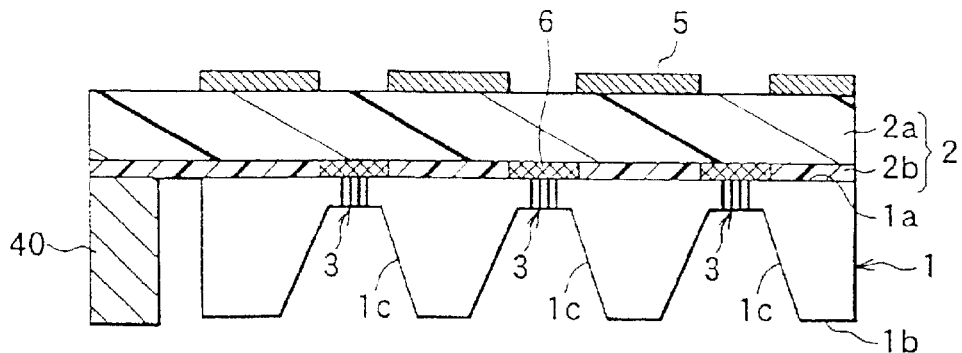
Figure 15B:
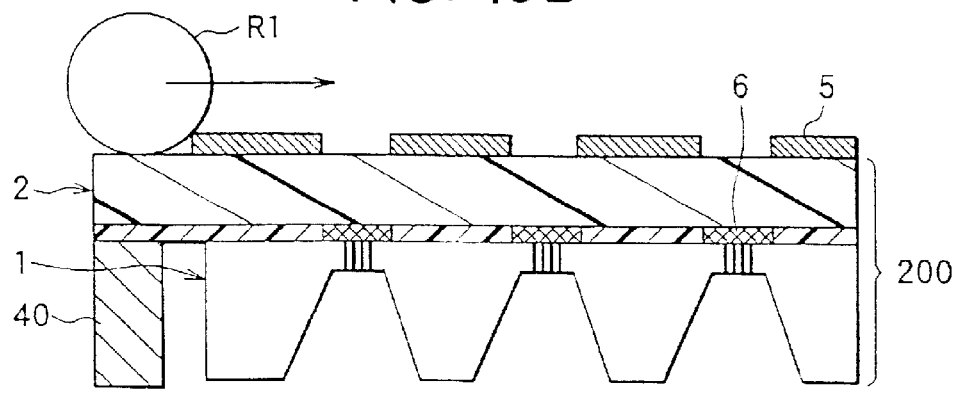

Next, the adhesive sheet attachment step shown in FIG. 15A is performed. In the present embodiment, the positioning between the sensing portions 3 and the hardened regions 6 of the first adhesive sheet 2 is carried out using the mask 5 as a reference while keeping the state where the mask 5 is attached to the first adhesive sheet 2 after the exposure. Then, the first adhesive sheet 2 is adhered to the surface 1a of the semiconductor wafer 1 with the adhesive 2b interposed therebetween. Specifically, the positioning is performed so that the sensing portions 3 look to be accommodated in the opening portions of the mask 5 when observed in an upper direction of the mask 5. The positioning may be performed using an alignment mark formed on the semiconductor wafer 1.

In the first adhesive sheet attachment step in the fifth embodiment, the mask 5 is then pressurized so that the first adhesive sheet 2 is closely adhered to the semiconductor wafer 1 in the state where the sensing portions 3 face the corresponding opening portions of the mask 5 attached to the first adhesive sheet 2. Specifically, the attachment of the first adhesive sheet 2 is performed by pressurizing the mask 5 from the upper side thereof using a roller R1 shown in FIG. 15B. Accordingly, adhesion between the adhesive 2b of the first adhesive sheet 2 at regions other than the hardened regions 6 and the semiconductor wafer 1 is improved. As a result, invasion of water into the sensing portions 3 from the adhering portions is prevented in and after the dicing-cut step, resulting in improved yield.

The roller R1 has a length corresponding to the width of the mask 5. Therefore, the roller R1 does not fall in the opening portions of the mask 5. The opening portions of the mask 5 serve as relief portions of the sensing portions 3 so that a load is not directly applied to the sensing portions 3 by the rolling, thereby preventing damages to the sensing portions 3. Thus, the first adhesive sheet attachment step is finished, and accordingly, the semiconductor device 200 is completed.

Figure 15C:
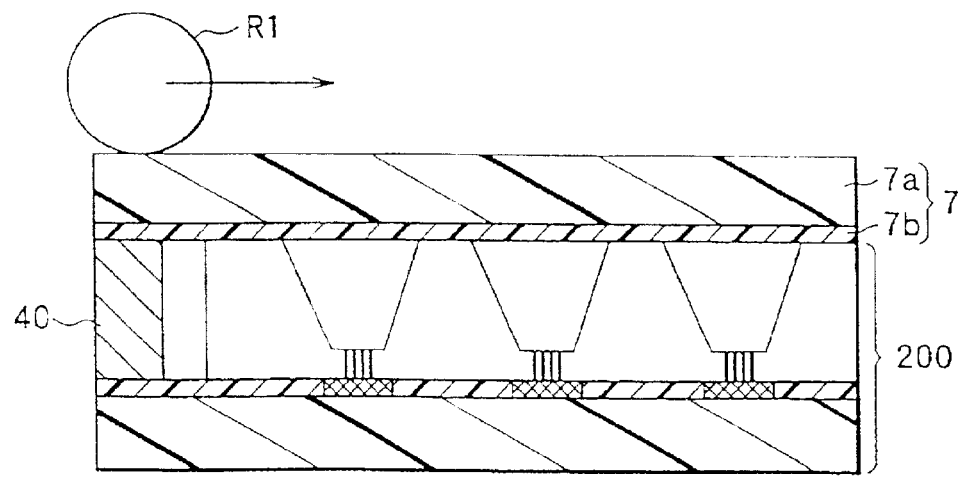

Next, after the mask 5 is detached from the first adhesive sheet 2, the second adhesive sheet attachment step shown in FIG. 15C is performed. At this step, the second adhesive sheet 7 is attached to the back surface 1b of the semiconductor wafer 1. The second adhesive sheet 7 is also closely adhered to the semiconductor wafer 1 by the roller R1. At the first and second adhesive sheet attachment steps, if necessary, the roller R1 or a work stage (not shown) may be heated to increase the adhesion.

Figure 16A:
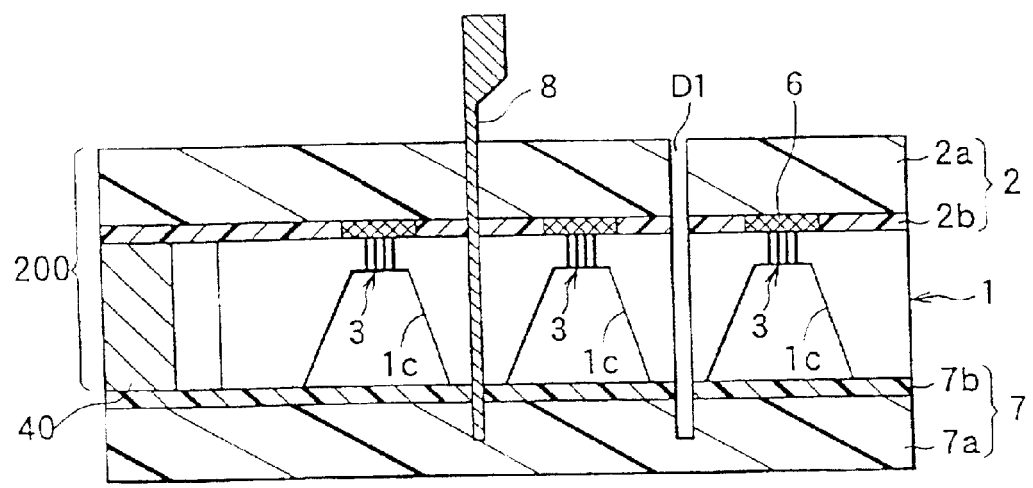
Figure 16B:
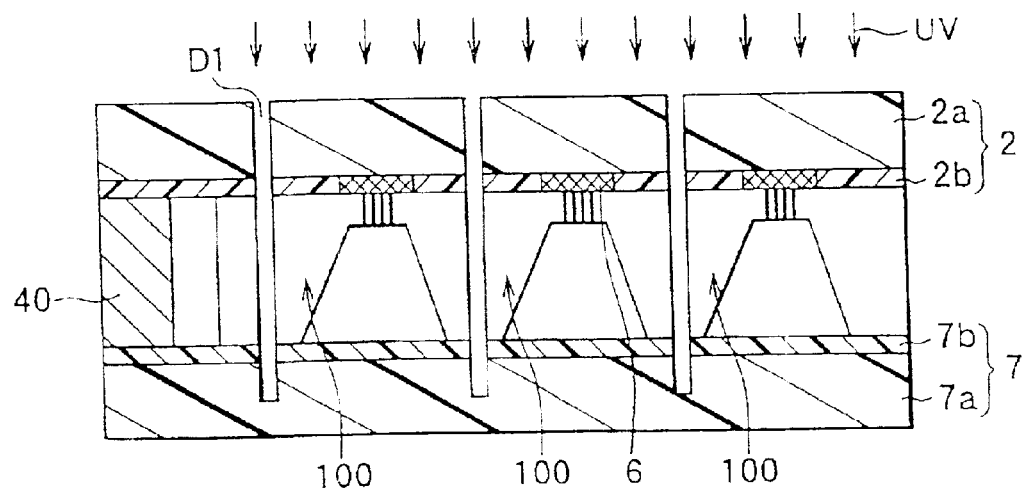

At the dicing-cut step shown in FIG. 16A, similarly to the first embodiment, the semiconductor wafer 1 is cut for chip units together with the first adhesive sheet 2 by the dicing blade 8. Accordingly, the semiconductor device 200 is divided into chips, and several acceleration sensors 100 are provided. Next, as shown in FIG. 16B, the adhesion entirely reducing step is performed substantially in the same manner as in the first embodiment. The adhesion of the adhesive 2b is entirely reduced by being exposed to UV.

Figure 17A:
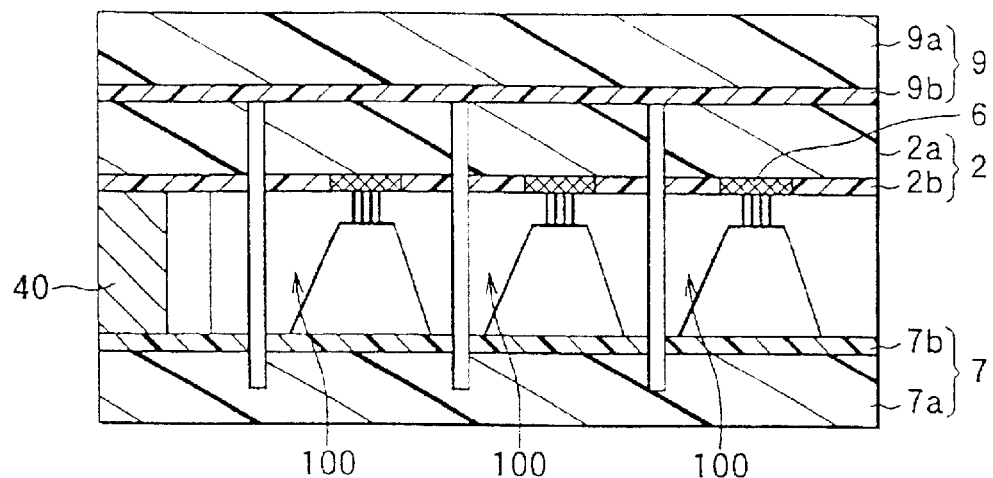
Figure 17B:
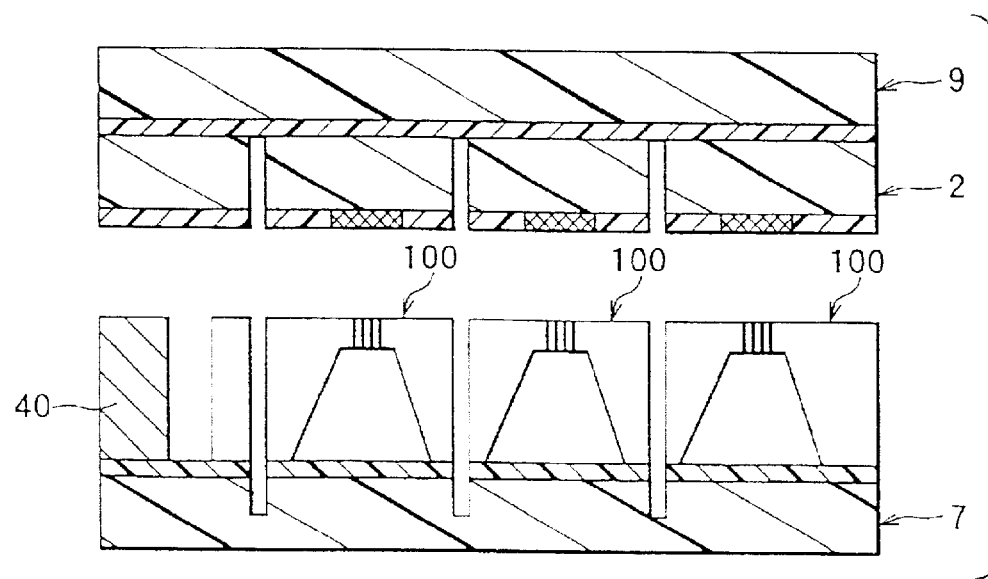

At the step shown in FIG. 17A, similarly to the first embodiment, the third adhesive sheet 9 is adhered to the surface of the adhesive sheet 2 at the side opposite to the adhesive 2b. To improve the adhesion of the third adhesive sheet 9, the first adhesive sheet 2 may be an adhesive double coated tape, both surfaces of which are coated with adhesive. At the first adhesive sheet removing step shown in FIG. 17B, similarly to the first embodiment, the first adhesive sheet 2 is removed together with the third adhesive sheet 9 from the divided acceleration sensors 100.

Figure 18A:
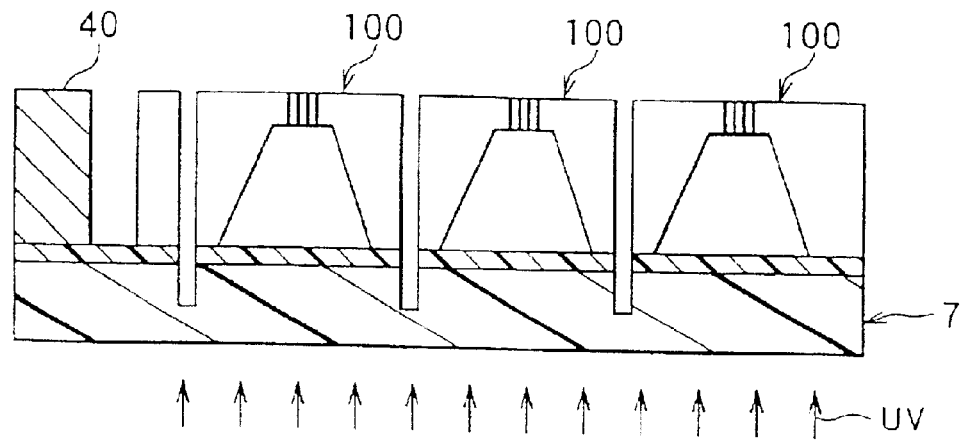
Figure 18B:
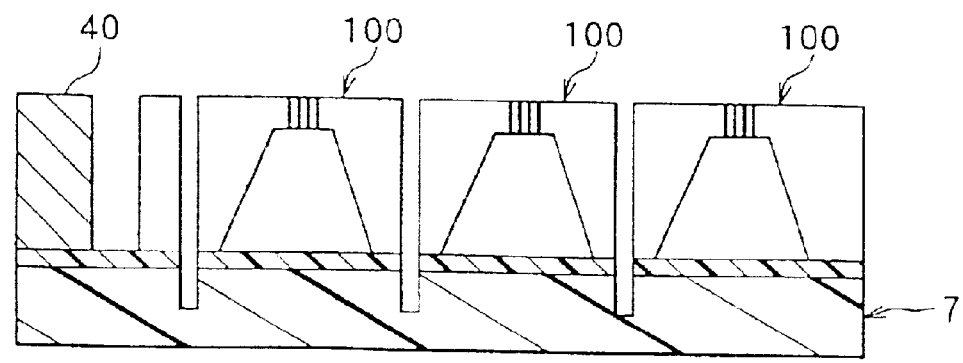

Next, as shown in FIG. 18A, the adhesion of the second adhesive sheet 7 is reduced by UV irradiation. FIG. 18B shows a configuration to be mounted to a package at a subsequent step after the adhesion of the second adhesive sheet 7 is reduced. The acceleration sensors 100 are respectively detached from the second adhesive sheet 7. One of the acceleration sensors 100 is, for example, mounted on a ceramic package by die-bonding, wire-bonding, or the like.

According to the present embodiment, in addition to the effects in the first embodiment, the positioning of the hardened regions 6 of the first adhesive sheet 2 to the sensing portions 3 is easy because it is performed using the mask 5 attached to the first adhesive sheet 2 as a reference at the first adhesive sheet attachment step. Further, according to the present embodiment, at the first adhesive sheet attachment step, the mask 5 attached to the first adhesive sheet 2 with the opening portions corresponding to the sensing portions 3 is pressurized by the roller R1, so that the first adhesive sheet 2 is securely adhered to the semiconductor wafer 1. As a result, the sensing portions 3 are prevented from being damaged, and adhesiveness can be improved.

The first adhesive sheet attachment step may be performed without rolling the roller R1. In this case, the opening portions of the mask 5 need not be physically opened. For example, a filter for allowing transmittance of UV at specific portions corresponding to the opening portions may be disposed. That is, the opening portions may be optically opened. The mask using the filter optically opening the specific portions can also facilitate the positioning between the hardened regions 6 to the sensing portions 3 as a reference.

(Sixth Embodiment)

A sixth preferred embodiment adopts a semiconductor wafer 1 having sensing portions exposed on both surfaces 1a, 1b thereof as in the first embodiment, and a dicing-cut method in the second embodiment described above. Accordingly, the semiconductor device 200 and the divided acceleration sensors 100 are produced. FIGS. 19 to 21 show the manufacturing process for manufacturing the acceleration sensors 100 in the sixth embodiment, in which the same parts as those in the first and second embodiments are indicated with the same reference numerals.

Figure 19A:
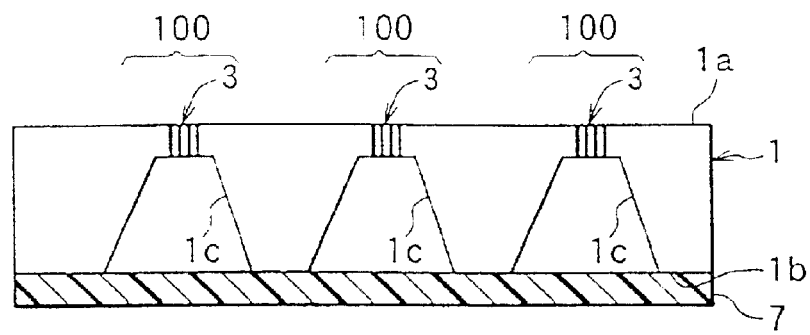
FIGS. 19A through 21B are cross-sectional views for explaining a manufacturing method of an acceleration sensor in a step-wise manner in a sixth preferred embodiment.
Figure 19B:
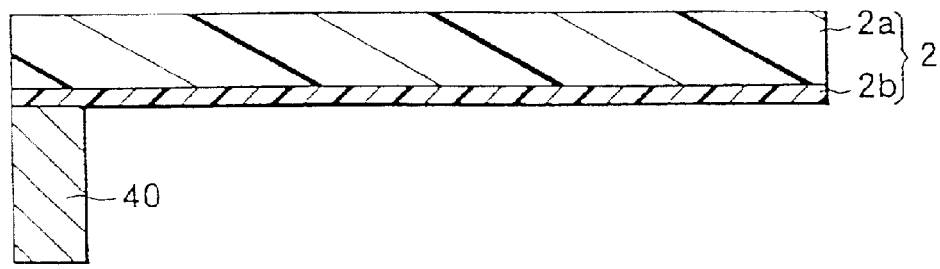
Figure 19C:
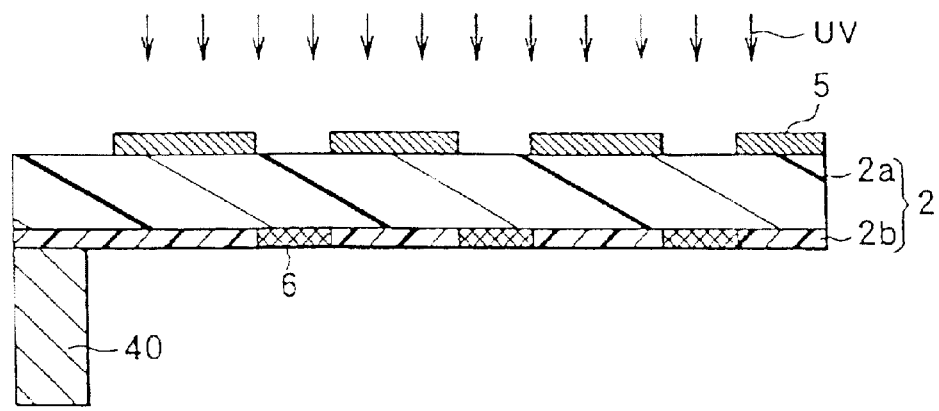

First, at the second adhesive sheet attachment step shown in FIG. 19A, the second adhesive sheet 7 is adhered to the back surface 1b of the semiconductor wafer 1. The second adhesive sheet 7 is composed of a resin adhesive sheet (adhesion sheet) made of, for example, polyimide film. At the adhesion selectively reducing step shown in FIGS. 19B and 19C, the first adhesive sheet (protective cap) 2 having the hardened regions 6 with reduced adhesion is formed substantially in the same manner as in the fifth embodiment.

Figure 20A:
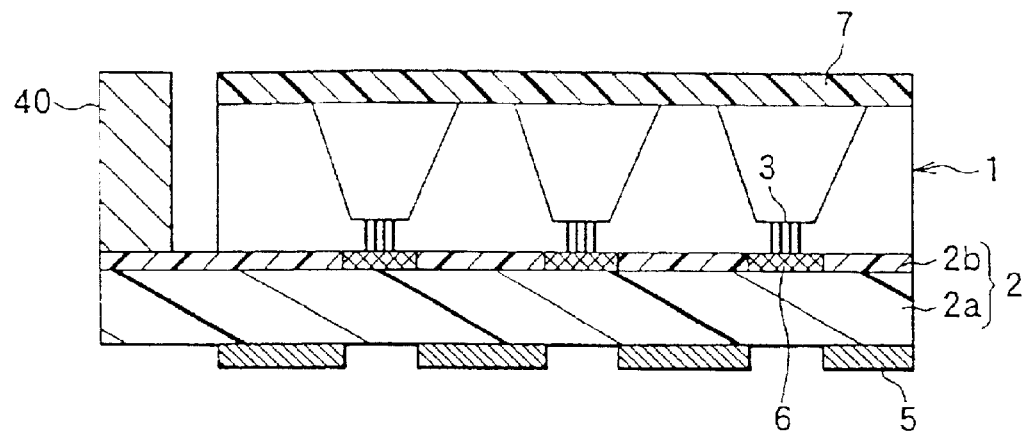
Figure 20B:
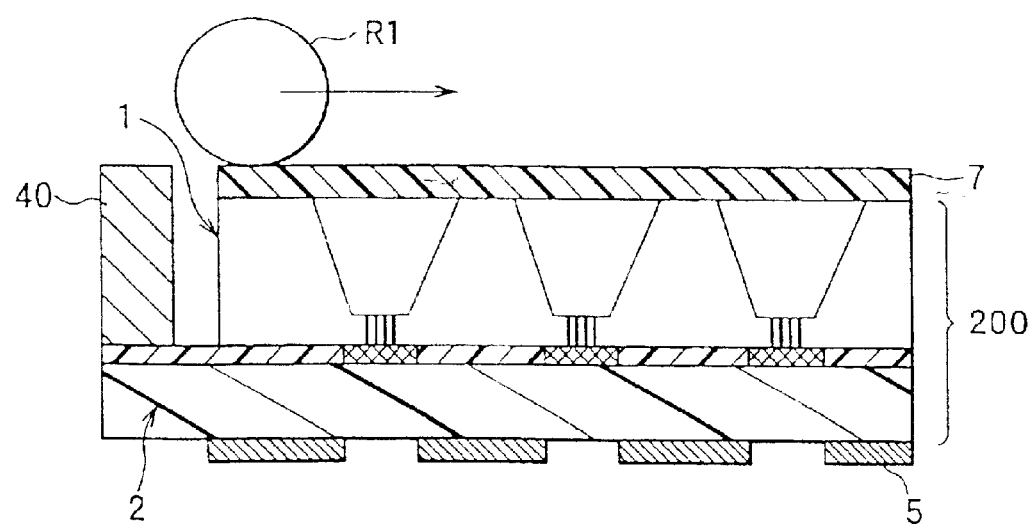
Figure 21A:
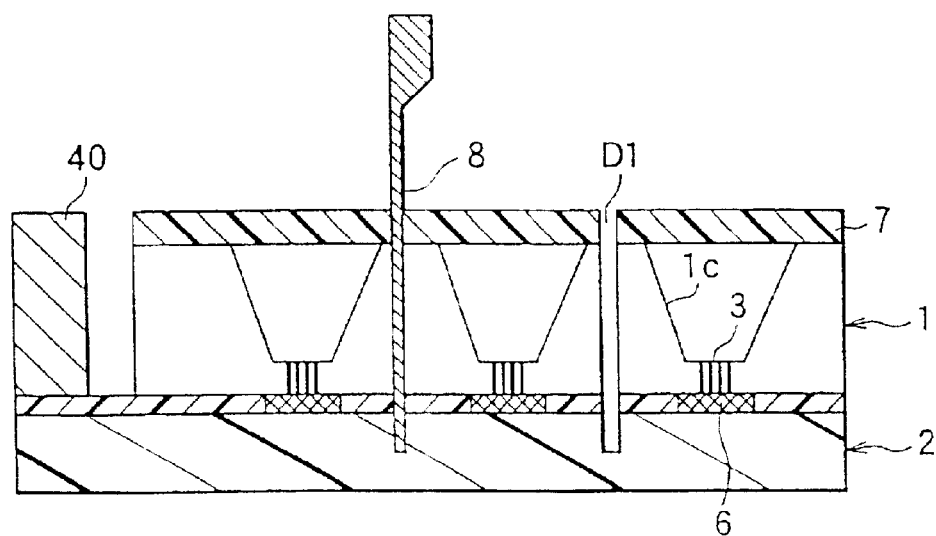

Next, at the first adhesive sheet attachment step shown in FIGS. 20A and 20B, the first adhesive sheet 2 is attached to the semiconductor wafer 1 while performing the positioning using the mask 5 as a reference substantially in the same manner as in the fifth embodiment. Then, the pressurization using the roller R1 is performed so that adhesion is improved. The roller R1 is rolled on the second adhesive sheet 7 attached to the back surface 1b of the semiconductor wafer 1 or on the mask 5. Since load is not directly applied to the sensing portions 3 due to the opening portions of the mask 5, the sensing portions 3 are prevented from being damaged. Thus, the first adhesive sheet attachment step is finished, thereby completing the semiconductor device 200.

Next, the mask 5 is detached from the first adhesive sheet 2. At the successive dicing-cut step shown in FIG. 21A, the semiconductor wafer 1 is cut together with the first and second adhesive sheets 2, 7 for chips by the dicing blade 8 in a direction from the back surface 1b to the surface 1a of the semiconductor wafer 1. Similarly to the second embodiment (see FIG. 10A), the first adhesive sheet 2 is integrally connected at the sheet member 2a after the dicing-cut step. The semiconductor device 200 is divided into chips by the dicing-cut step, so that several acceleration sensors 100 are produced.

Figure 21B:
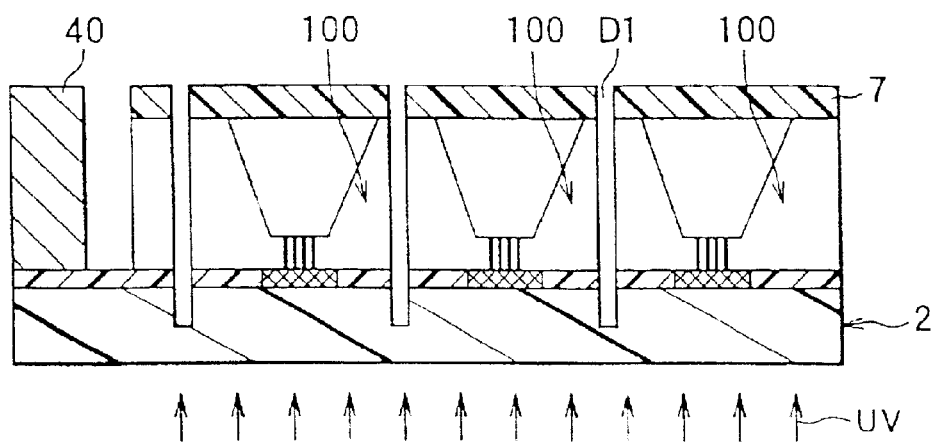

At the adhesion entirely reducing step shown in FIG. 21B, similarly to the second embodiment (see FIG. 10B), the first adhesive sheet 2 is exposed to UV so that its adhesion is entirely reduced. Then, as in the second embodiment, the first adhesive sheet 2 is removed from the chips while being expanded. In the sixth embodiment, since the second adhesive sheet 7 is attached to the semiconductor wafer 1 before the first adhesive sheet 2 is attached, the rolling of the roller R1 is performed only once. Further, since the first adhesive sheet 2 is integrally connected after the dicing-cut step, it is not necessary to use the third adhesive sheet as in the fifth embodiment when the first adhesive sheet 2 is removed from the acceleration sensors (chips) 100. According to the present embodiment, the number of steps is reduced in addition to the effects in the fifth embodiment.

(Seventh Embodiment)

In the sixth embodiment, as shown in FIG. 21B, the arrangement to be mounted onto a package at a subsequent step is inverted as compared to that in the fifth embodiment. That is, the surface 1a of the acceleration sensor 100, i.e., the main surface of the chip is disposed at the downside. This arrangement requires a pick-up system for inverting the chip during the transportation of the chip into the package.

As opposed to this, in a seventh preferred embodiment, the arrangement to be mounted to the package is set to be identical with that in the fifth embodiment to dispense with the pick-up system. FIGS. 22 and 23 show a manufacturing process for manufacturing several acceleration sensors 100 in cross-section, in which the same parts as those in the embodiments described above are indicated with the same reference numerals.

Figure 22A:
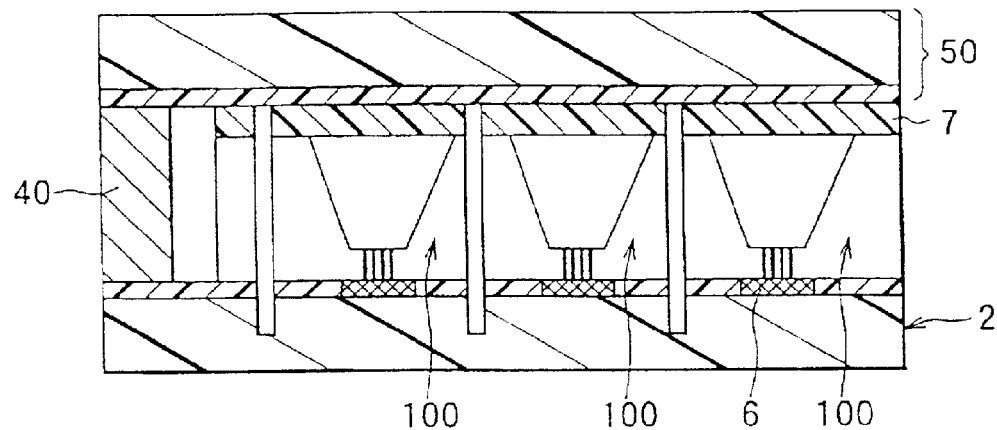
FIGS. 22A through 23B are cross-sectional views for explaining a manufacturing method of acceleration sensors in a step-wise manner in a seventh preferred embodiment.

First, in the seventh embodiment, the steps shown in FIGS. 19A to 21A are performed substantially in the same manner as in the sixth embodiment. Successively, as shown in FIG. 22A, a sheet 50 is attached to the back surface 1b of the semiconductor wafer 1 through the second adhesive sheet 7. The sheet 50 may be composed of a UV setting adhesive sheet similarly to the first adhesive sheet 2 described above, otherwise, of a pressure sensitive sheet.

Figure 22B:
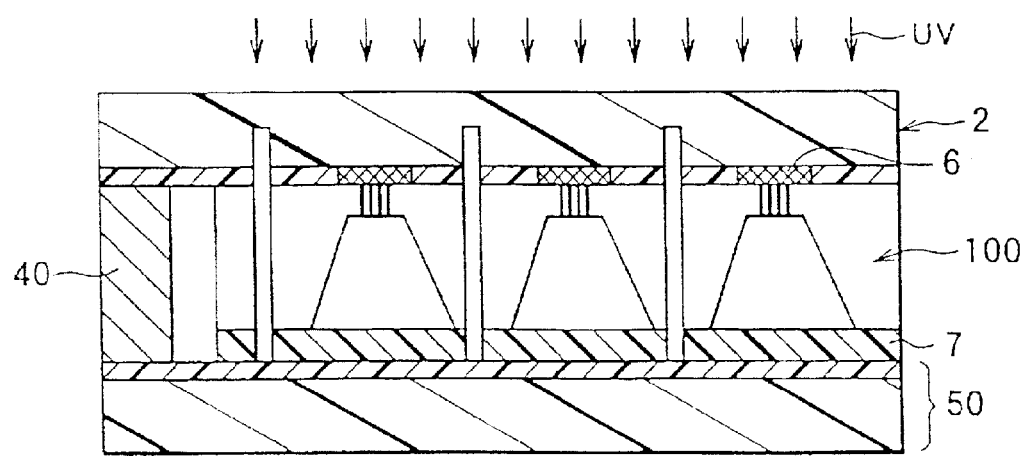
Figure 23A:
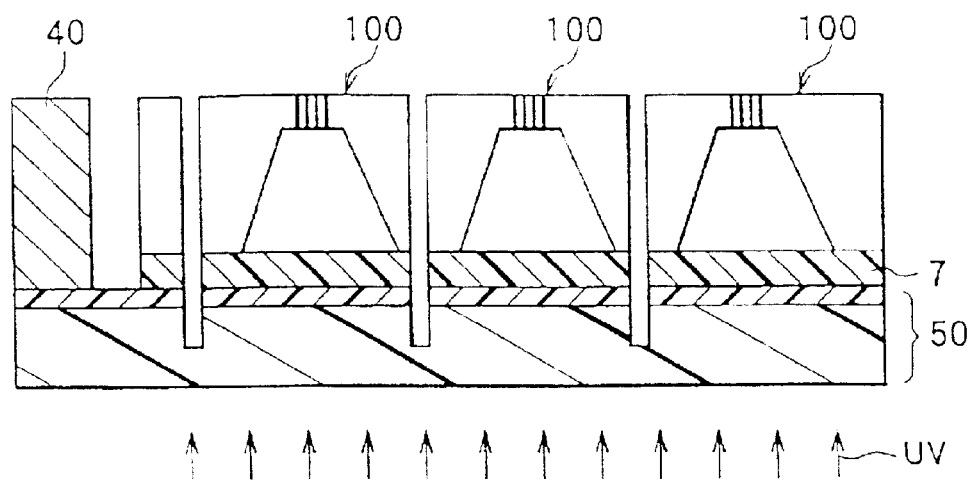
Figure 23B:
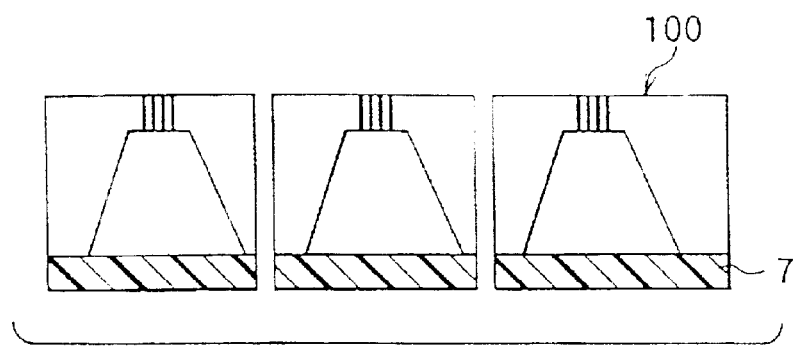

Next, as shown in FIG. 22B, the surface of the first adhesive sheet 2 at the side opposite to the adhesive 2b is exposed to UV (having a wavelength of 365 nm or less) so that adhesion is reduced at regions (non-exposed portions) other than the hardened regions 6. Then, the first adhesive sheet 2 is detached from the semiconductor wafer 1. Next, as shown in FIG. 23A, when the sheet 50 is a UV setting adhesive sheet, the back surface of the sheet 50 is exposed to UV so that its adhesion is reduced. When the sheet 50 is a pressure sensitive sheet, the adhesion is reduced by heating. Accordingly, the arrangement to be mounted to the package is provided. In this case, since the surface 1a of the acceleration sensor 100, i.e., the main surface side of the chip is disposed at the upper side, it is not necessary to use the pick-up system. Incidentally, as shown in FIG. 23B, the chip is finally provided with the adhesive film attached to the back surface thereof.

(Other Embodiments)

The hardened regions 6 having reduced adhesion selectively provided in the adhesive sheet 2 may be formed by selective UV irradiation using the mask 5 after the adhesive sheet 2 is attached to the semiconductor wafer 1. The adhesive 2b of the adhesive sheet 2 may be adhesive made of, for example, resin that is hardened by polymerization caused by a ray other than UV, radiation, or the like, in addition to the UV setting adhesive. The sheet member 7a and the adhesive 7b of the second adhesive sheet 7 may have the same constitution as that of the adhesive sheet 2.

When at least one of the sheet members 2a, 7a and the adhesives 2b, 2b of the adhesive sheets 2, 7 is made of a conductive material, the protective cap can prevent sticking of the capacity detecting electrode caused by static electricity, and prevent damages to peripheral circuits by static electricity. To make the member conductive, for example, a conductive material such as metallic powder may be contained in the UV setting resin.

When the adhesive sheet attachment step is carried out in inert gas, the inside of the protective cap is filled with inert gas. This constitution provides a damping effect for protecting the sensing portions 3 from external impacts as an air damper. In the embodiments described above, the protective cap is provisionally provided relative to the capacity type acceleration sensor; however, the present invention can be applied to other chips formed with mechanically weak structures such as a yaw rate sensor and a pressure sensor having a diaphragm as an exposed structure and to an air-bridge wiring structure, in addition to the acceleration sensor.

The manufacturing method in the second embodiment, i.e., the manufacturing method of the semiconductor device including the step for attaching the adhesive sheet 2 to the semiconductor wafer 1, and the step of cutting the semiconductor wafer 1 together with the adhesive sheet 2 by dicing can be effectively applied to other cases where, for example, a chip having a large size of 25 mm$^2$ or more is picked up from the adhesive sheet-after dicing-cut, in addition to the semiconductor wafer having exposed structure portions (sensing portions 3 and the like). When the large sized chip is adhered to the adhesive sheet 2, since the adhesion of the flat adhesive sheet 2 is selectively reduced in advance, the separation of the chip is easily carried out without damaging the chip.

While the present invention has been shown and described with reference to the foregoing preferred embodiments, it will be apparent to those skilled in the art that changes in form and detail may be made therein without departing from the scope of the invention as defined in the appended claims.

What is claimed is:

1. A semiconductor device comprising:
   a semiconductor wafer having a structure portion exposed on a surface thereof; and
   an adhesive sheet detachably attached to the surface of the semiconductor wafer and covering the structure portion, the adhesive sheet having a flat sheet member and an adhesive portion provided generally on an entire surface of the sheet member, the adhesive portion having a specific region facing the structure portion and a vicinal region surrounding the specific region, where the snecific region exhibits an adhesive characteristic having a value less than an adhesive characteristic exhibited by the vicinal region.

2. The semiconductor device of claim 1, wherein the adhesive portion is made of UV setting adhesive, an adhesion of which is reduced by UV.

3. The semiconductor device of claim 1, wherein at least one of the adhesive sheet and the adhesive portion is made of a conductive material.

4. The semiconductor device of claim 1, wherein:
   the adhesive sheet has a flat surface contacting the semiconductor wafer; and
   the specific region and the vicinal region of the adhesive portion form a part of the flat surface of the adhesive sheet.

5. The semiconductor device of claim 1, wherein the sheet member is made of a material that transmits UV.

6. The semiconductor device of claim 1 wherein the specific region of the adhesive portion opposes a sensing element formed on the structural portion of the semiconductor wafer.

7. A semiconductor device comprising:
   a semiconductor wafer having a structure portion exposed on a surface thereof; and
   an adhesive sheet detachably attached to the surface of the semiconductor wafer and covering the structure portion, the adhesive sheet having a flat sheet member and an adhesive portion provided generally on an entire surface of the sheet member, the adhesive portion having a specific region facing the structure portion, the specific region having an adhesion less than that of a vicinal region of the adhesive portion surrounding the specific region, wherein at least one of the adhesive sheet and the adhesive portion is made of a conductive material.

8. A semiconductor device comprising:
   a semiconductor wafer having a structure portion exposed on a surface thereof; and
   an adhesive sheet detachably attached to the surface of the semiconductor wafer and covering the structure portion, the adhesive sheet having a flat sheet member and an adhesive portion provided generally on an entire surface of the sheet member and exhibiting an adhesion that varies across the surface of the sheet member.

9. The semiconductor device of claim 8 wherein the adhesive portion having a specific region facing the structure portion and a vicinal region surrounding the specific region, where the specific region exhibits an adhesive characteristic having an adhesive force that is less than an adhesive characteristic exhibited by the vicinal region.

10. The semiconductor device of claim 9 wherein a sensing element is formed on the structural portion of the semiconductor wafer.

11. A semiconductor device comprising:
   a semiconductor wafer having a structure portion exposed on a surface thereof; and
   an adhesive sheet detachably attached to the surface of the semiconductor wafer and covering the structure portion, the adhesive sheet having a flat sheet member and an adhesive portion provided generally on an entire surface of the sheet member, the adhesive portion having a specific region facing the structure portion, the specific region having an adhesion less than that of a vicinal region of the adhesive portion surrounding the specific region, wherein a sensing element is formed on the structural portion of the semiconductor wafer.

* * * * *